United States Patent
Takahashi

(10) Patent No.: US 8,284,285 B2
(45) Date of Patent: Oct. 9, 2012

(54) DUTY CORRECTION CIRCUIT, DELAY LOCKED LOOP CIRCUIT, COLUMN A/D CONVERTER, SOLID-STATE IMAGING DEVICE AND CAMERA SYSTEM

(75) Inventor: Tomohiro Takahashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 81 days.

(21) Appl. No.: 12/929,441

(22) Filed: Jan. 25, 2011

(65) Prior Publication Data

US 2011/0187907 A1 Aug. 4, 2011

(30) Foreign Application Priority Data

Feb. 3, 2010 (JP) ................. P2010-021898

(51) Int. Cl.
*H04N 5/335* (2006.01)
*H04N 5/228* (2006.01)
(52) U.S. Cl. ............... 348/302; 348/222.1; 327/156; 327/175; 341/164
(58) Field of Classification Search ........... 348/302, 348/294, 222.1, 207.99; 327/156, 158, 161, 327/175, 147, 149, 172; 341/164, 126
See application file for complete search history.

(56) References Cited

U.S. PATENT DOCUMENTS

| | | | | |
|---|---|---|---|---|
| 6,380,778 | B2 * | 4/2002 | Uehara et al. | 327/175 |
| 6,452,432 | B2 * | 9/2002 | Kim | 327/158 |
| 2004/0051801 | A1 | 3/2004 | Iizuka et al. | |
| 2006/0232311 | A1 * | 10/2006 | Kitayama | 327/172 |
| 2010/0060334 | A1 * | 3/2010 | Abe et al. | 327/158 |
| 2011/0221495 | A1 * | 9/2011 | Lee et al. | 327/158 |
| 2011/0298504 | A1 * | 12/2011 | Becker et al. | 327/149 |

FOREIGN PATENT DOCUMENTS

| | | |
|---|---|---|
| JP | 2001-326564 | 11/2001 |
| JP | 2004-111590 | 4/2004 |
| JP | 3753925 | 3/2006 |
| JP | 2008-092091 | 4/2008 |

* cited by examiner

*Primary Examiner* — Aung S Moe
(74) *Attorney, Agent, or Firm* — Rader Fishman & Grauer, PLLC

(57) ABSTRACT

A duty correction circuit includes: a C-element including a first input and a second input; and an inverter connected to the second input of the C-element, wherein the C-element obtains an output of a logic "1" when both inputs are the logic "1", obtains an output of a logic "0" when both inputs are the logic "0", and maintains the output to a previous state in other conditions, and complementary clocks having a phase difference of an approximately half cycle are inputted to the first input of the C-element and the inverter respectively.

11 Claims, 17 Drawing Sheets

WHEN DUTY RATIO IS 50%

WHEN DUTY RATIO DEVIATES

FIG.3
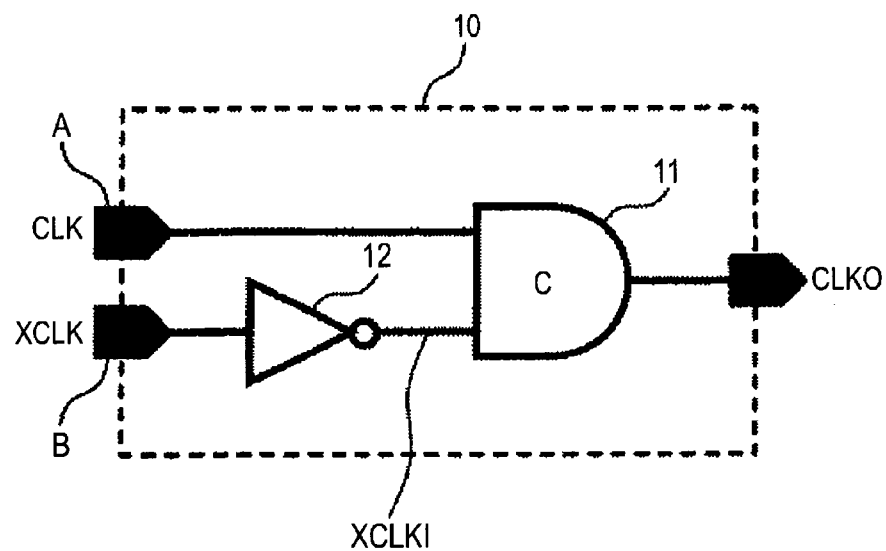
FIG.4A
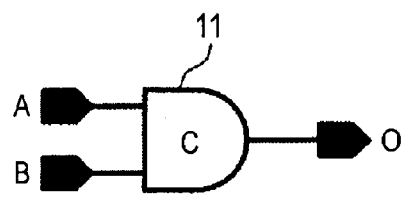
FIG.4B
| A | B | O |
|---|---|---|
| 0 | 0 | 0 |
| 0 | 1 | MAINTAINED |
| 1 | 0 | MAINTAINED |
| 1 | 1 | 1 |

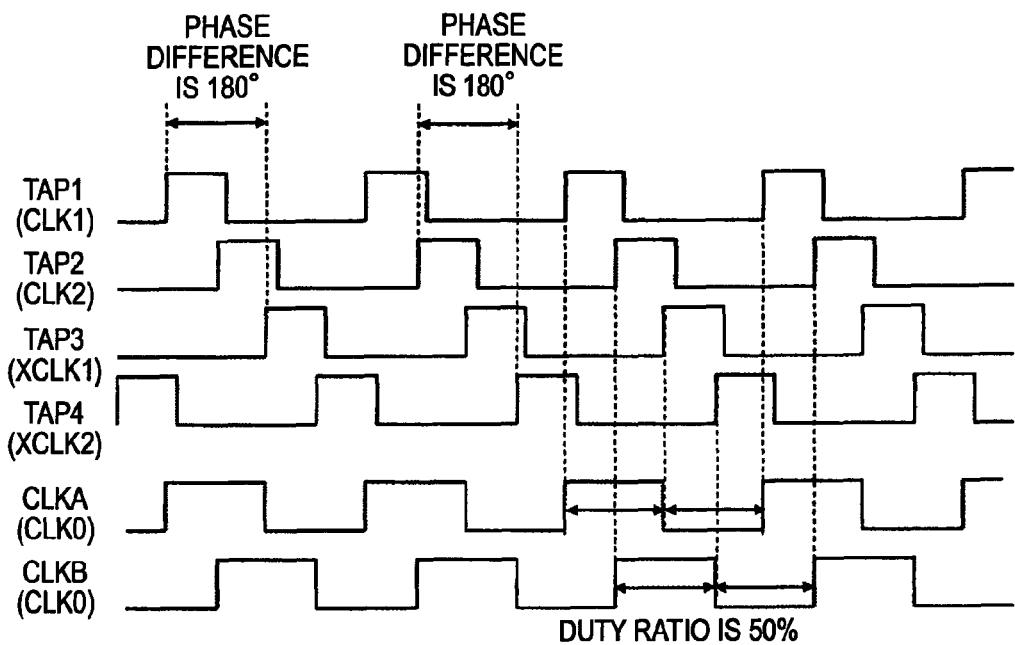
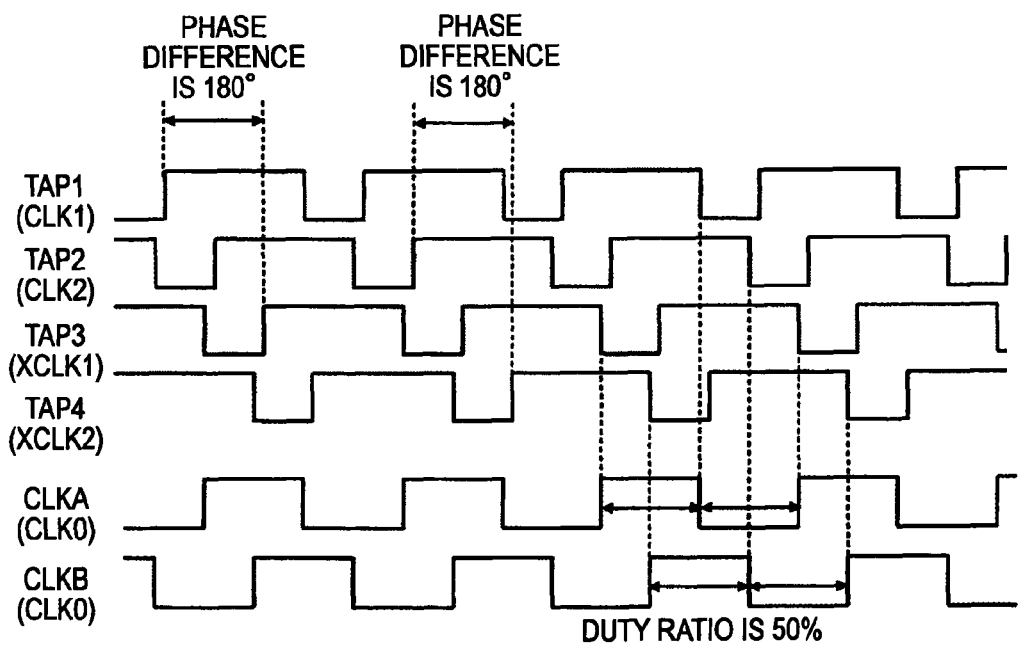

DUTY CORRECTION CIRCUIT, DELAY LOCKED LOOP CIRCUIT, COLUMN A/D CONVERTER, SOLID-STATE IMAGING DEVICE AND CAMERA SYSTEM

BACKGROUND OF THE INVENTION

1. Field of the Invention

The present invention relates to a duty correction circuit correcting a clock duty ratio, a delay locked loop circuit (DLL circuit), a column A/D converter, a solid-state imaging device and a camera system using the duty correction circuit.

2. Description of the Related Art

Generally, in a logic circuit including a sequential circuit and a combination circuit, the sequential circuit is latch-operated to be synchronized with a clock signal.

A flip flop which is a storage device used for the sequential circuit has minimum values in which the device can be operated in a width of a Hi-period and a width of a Low-period of a clock input waveform respectively.

When the clock duty ratio is shifted from 50%, limitations to high-speed operation may be previously determined in the flip flop in view of the clock width.

The minimum values are determined with respect to the width of the Hi-period and the width of the Low-period respectively not with respect to a clock pulse cycle.

Accordingly, the duty ratio, namely, the ratio of the Hi-level period in a signal cycle of the clock signal is preferably 50% in various applications of the logic circuit.

In JP-A-2008-92091 (Patent Document 1), an integrating-type A/D converter is disclosed, which obtains information of lower bits by a Time-to-Digital Converter (TDC) latching and decoding clock signals having different phases using a normal higher bit counter and a ring oscillator.

The duty ratio of the clock signal is preferably 50% also in the integrating-type A/D converter.

FIG. 1 is a diagram showing a configuration of an A/D converter in a system disclosed in Patent Document 1.

An A/D converter 1 includes a comparator 2, a PLL circuit 3, a TDC (Time-to-Digital Converter which performs latch and decode) 4, a higher counter 5 and a transfer bus 6.

In the example, an integrating-type A/D converter having total resolution of 12-bit obtained by adding 10-bit in the higher counter 5 to 2-bit in the lower TDC 4 is shown by using two clock signals CLKA, CLKB whose phases are different by 90 degrees.

A reference voltage RAMP having a ramp waveform in which a voltage value linearly varies with time is compared to an input voltage VSL in the comparator 2, and a compared result is outputted as a signal VCO.

The higher counter 5 starts or stops operations at a timing when the signal VCO varies, and the lower TDC 4 latches information of the clock signals having different phases.

FIGS. 2A, 2B are diagrams for explaining the principle of the lower TDC which obtains resolution higher than a clock frequency.

When values of two clock signals CLKA, CLKB whose phases are different by 90 degrees are latched at the timing when the signal VCO varies, four types of phase information can be obtained in one cycle of the clock frequency.

Information of lower 2-bits can be obtained by decoding the four types of codes.

As the duty ratio of both clock signals is 50% in FIG. 2A, appearance probability of the four types of codes is equal, however, when the duty ratio of the clock signals deviates as shown in FIG. 2B, appearance probability of codes is biased.

This reduces DNL (differential non linearity) which is one of performance indexes of the A/D converter.

Accordingly, it is desirable that the duty ratio of the clock signal is 50% also in this case.

On the other hand, a duty correction circuit having a first latch circuit and a second latch circuit is proposed in Japanese Patent No. 3753925 (Patent Document 2).

In the first latch circuit, an output of one NAND gate is feedback connected to an input of the other NAND gate in respective NAND gates, and complementary clock signals in whose phase difference is a half cycle are supplied to the other inputs of respective NAND gates.

In the second latch circuit, an output of one NAND gate is feedback connected to an input of the other NAND gate in respective NAND gates, and outputs of the respective NAND gates of the first latch circuit are supplied to the other inputs of the respective NAND gates. A duty correction circuit including NOR gates instead of the NAND gates is also proposed.

SUMMARY OF THE INVENTION

However, in the above system, in the first latch circuit including two NAND gates, the duty ratio of the clock signal is corrected only when the duty ratio of the clock signal is higher than 50%, that is, the Hi-period is longer due to the configuration.

Therefore, the case when the Hi-period is short is addressed by using the second latch circuit.

Accordingly, not only the number of transistors is increased to some degree but the number of times of switching differs when the duty ratio of the complementary clock to be inputted is higher than 50% and when the duty ratio of the clock is lower than 50%, as a result, power consumption is not stable.

Conversely, in the circuit using the NOR gate, the duty ratio is corrected only when the duty ratio of the clock signal is lower than 50%, that is, the Hi-period is shorter due to the configuration.

Therefore, the case when the Hi-period is long is addressed by using the second latch circuit also in this case. Consequently, the circuit has the same problems as the above.

In view of the above, it is desirable to provide a duty correction circuit, a DLL circuit, a column A/D converter, a solid-state imaging device and a camera system capable of addressing both the case where the duty ratio is higher than 50% as well as the case where the duty ratio is lower than 50% by one device, therefore, it is possible not only to reduce the number of devices but also to reduce the number of times of switching, as a result, power consumption can be reduced.

According to an embodiment of the invention, there is provided a duty correction circuit including a C-element including a first input and a second input and an inverter connected to the second input of the C-element, in which the C-element obtains an output of a logic "1" when both inputs are the logic "1", obtains an output of a logic "0" when both inputs are the logic "0", and maintains the output to a previous state in other conditions, and in which complementary clocks having a phase difference of an approximately half cycle are inputted to the first input of the C-element and the inverter respectively.

According to another embodiment of the invention, there is provided a DLL circuit including a delay line generated by plural delay elements connected to a clock input in cascade, a delay loop having a delay locked loop (DLL) function of performing delay synchronization to lock the circuit by comparing phase difference between an inputted clock and a clock delayed for one cycle through the delay line and at least one duty correction circuit to which two clocks having a phase difference of an approximately half cycle in the delay line are inputted, in which the duty correction circuit has a C-element including a first input and a second input, and an inverter connected to the second input of the C-element, in which the C-element obtains an output of a logic "1" when both inputs are the logic "1", obtains an output of a logic "0" when both inputs are the logic "0", and maintains the output to a previous state in other conditions, and in which complementary clocks having a phase difference of an approximately half cycle are inputted to the first input of the C-element and the inverter respectively.

According to still another embodiment of the invention, there is provided a column A/D converter including a DLL circuit having a delay locked loop (DLL) function of performing delay synchronization to lock the circuit by comparing phase difference between an inputted clock and a clock delayed for one cycle through a delay line and supplying complementary clocks having a phase difference of an approximately half cycle obtained by performing delay synchronization based on the input clock, plural clock transfer lines through which the complementary clocks are propagated and integrating-type analog/digital (A/D) converters arranged in parallel, to which the complementary clocks transferred through the clock transfer lines are supplied, in which each integrating-type A/D converter has a comparator comparing a reference voltage having a ramp waveform in which a voltage value linearly varies with time to an input voltage, a higher bit counter starting and stopping operations by taking inversion of an output signal of the comparator as a trigger, counting clocks by each clock cycle of one of the clocks, and a time-to-digital converter outputting lower bits having higher resolution than a clock cycle by latching phase information at a timing when the output signal of the comparator is inverted by the complementary clocks and by decoding the latched value, and a duty correction circuit is arranged at least at any of an output stage of the complementary clocks of the DLL circuit, the clock transfer lines and an input stage of the complementary clocks from the clock transfer lines in each integrating-type A/D converter, in which the duty correction circuit includes a C-element including a first input and a second input, and an inverter connected to the second input of the C-element, in which the C-element obtains an output of a logic "1" when both inputs are the logic "1", obtains an output of a logic "0" when both inputs are the logic "0", and maintains the output to a previous state in other conditions, and in which complementary clocks having a phase difference of an approximately half cycle are inputted to the first input of the C-element and the inverter respectively.

According to yet another embodiment of the invention, there is provided a solid-state imaging device including a pixel unit in which plural pixels performing photoelectric conversion are arranged in a matrix state and a pixel-signal reading unit reading pixel signals from the pixel unit by units of respective plural pixels, in which the pixel signal reading unit has a column A/D converter in which integrating-type analog/digital (A/D) converters converting read analog signals into digital signals are arranged in parallel so as to correspond to column arrangement of pixels, in which the column A/D converter includes a DLL circuit having a delay locked loop (DLL) function of performing delay synchronization to lock the circuit by comparing phase difference between an inputted clock and a clock delayed for one cycle through a delay line and supplying complementary clocks having a phase difference of an approximately half cycle obtained by performing delay synchronization of the input clock, plural clock transfer lines through which the complementary clocks are propagated and integrating-type analog/digital (A/D) converters arranged in parallel, to which the complementary clocks transferred through the clock transfer lines are supplied, in which each integrating-type A/D converter has a comparator comparing a reference voltage having a ramp waveform in which a voltage value linearly varies with time to an input voltage, a higher bit counter starting and stopping operations by taking inversion of an output signal of the comparator as a trigger, counting clocks by each clock cycle of one of the clocks, and a time-to-digital converter outputting lower bits having higher resolution than a clock cycle by latching phase information at a timing when the output signal of the comparator is inverted by the complementary clocks and by decoding the latched value, and a duty correction circuit is arranged at least at any of an output stage of the complementary clocks of the DLL circuit, the transfer lines of the clocks and an input stage of the complementary clocks from the clock transfer lines in each integrating-type A/D converter, in which the duty correction circuit includes a C-element including a first input and a second input, and an inverter connected to the second input of the C-element, in which the C-element obtains an output of a logic "1" when both inputs are the logic "1", obtains an output of a logic "0" when both inputs are the logic "0", and maintains the output to a previous state in other conditions, and in which complementary clocks having a phase difference of an approximately half cycle are inputted to the first input of the C-element and the inverter respectively.

According to still yet another embodiment of the invention, there is provided a camera system including a solid-state imaging device and an optical system imaging a subject image on the solid-state imaging device, in which the solid-state imaging device includes a pixel unit in which plural pixels performing photoelectric conversion are arranged in a matrix state, and a pixel-signal reading unit reading pixel signals from the pixel unit by units of respective plural pixels, in which the pixel signal reading unit includes a column A/D converter in which integrating-type analog/digital (A/D) converters converting read analog signals into digital signals are arranged in parallel so as to correspond to column arrangement of pixels, in which the column A/D converter includes a DLL circuit having a delay locked loop (DLL) function of performing delay synchronization to lock the circuit by comparing phase difference between an inputted clock and a clock delayed for one cycle through a delay line and supplying complementary clocks having a phase difference of an approximately half cycle obtained by performing delay synchronization of the input clock, plural clock transfer lines through which the complementary clocks are propagated and integrating-type analog/digital (A/D) converters arranged in parallel, to which the complementary clocks transferred through the clock transfer lines are supplied, in which each integrating-type A/D converter has a comparator comparing a reference voltage having a ramp waveform in which a voltage value linearly varies with time to an input voltage, a higher bit counter starting and stopping operations by taking inversion of an output signal of the comparator as a trigger, counting clocks by each clock cycle of one of the clocks, and a time-to-digital converter outputting lower bits having higher resolution than a clock cycle by latching phase information at a timing when the output signal of the comparator is inverted by the complementary clocks and by decoding the latched value, and a duty correction circuit is arranged at least at any of an output stage of the complementary clocks of the DLL circuit, the transfer lines of the clocks and an input stage of the complementary clocks from the clock transfer line in each integrating-type A/D converter, in which the duty correction circuit has a C-element including a first input and a second input, and an inverter connected to the second input of the C-element, in which the C-element obtains an output of a logic "1" when both inputs are the logic "1", obtains an output of a logic "0" when both inputs are the logic "0", and maintains the output to a previous state in other conditions, and in which complementary clocks having a phase difference of an approximately half cycle are inputted to the first input of the C-element and the inverter respectively.

According to the embodiments of the invention, both the case where the duty ratio is higher than 50% as well as the case where the duty ratio is lower than 50% can be addressed by one device, therefore, it is possible not only to reduce the number of devices but also to reduce the number of times of switching, as a result, power consumption can be reduced.

BRIEF DESCRIPTION OF THE DRAWINGS

FIG. 3 is a diagram showing a configuration example of a duty correction circuit according to a first embodiment of the invention;

FIGS. 4A and 4B are views showing symbols and a truth-value table of a Muller C-element;

FIG. 10 is a diagram showing operation waveforms of the DLL circuit of FIG. 9 when the duty ratio of the inputted complementary clocks is lower (thinner) than 50%;

FIG. 11 is a diagram showing operation waveforms of the DLL circuit of FIG. 9 when the duty ratio of the inputted complementary clocks is higher (thicker) than 50%;

DESCRIPTION OF THE PREFERRED EMBODIMENTS

Hereinafter, embodiments of the invention will be explained with reference to the drawings.

The explanation will be made in the following order.
1. First Embodiment (a first configuration example of a duty correction circuit)
2. Second Embodiment (a second configuration example of the duty correction circuit)
3. Third Embodiment (a first example of the duty correction circuit applied to a DLL circuit)
4. Fourth Embodiment (a second example of the duty correction circuit applied to the DLL circuit)
5. Fifth Embodiment (First example of the duty correction circuit applied to a column A/D converter)
6. Sixth Embodiment (An example of the duty correction circuit applied to a clock transfer line)
7. Seventh Embodiment (Second example of the duty correction circuit applied to the column A/D converter)
8. Eighth Embodiment (Third example of the duty correction circuit applied to the column A/D converter)
9. Ninth Embodiment (Whole configuration example of a solid-state imaging device)
10. Tenth Embodiment (Configuration example of a camera system)

1. First Embodiment

[A First Configuration Example of a Duty Correction Circuit]
FIG. 3 is a diagram showing a configuration example of a duty correction circuit according to a first embodiment of the invention.

A duty correction circuit 10 includes one C element 11 and an inverter 12 connected to one input of the C element 11.

When complementary clocks CLK, XCLK having a phase difference of an approximately half cycle are inputted to two inputs A, B, the duty correction circuit 10 recovers the duty ratio of an output CLKO to approximately 50% even when the duty ratio of the clock signal CLK deviates.

As the C-element 11 is symmetric as explained as follows, the correction function of the duty ratio is maintained when the inverter 12 is connected to whichever input, however, the phase of the output clock is reversed.

[Function of the C-Element]
Here, a configuration and a function of the C-element will be explained.

FIGS. 4A and 4B are views showing symbols and a truth-value table of a Muller C-element.

The C-element 11 used in the duty correction circuit 10 in the embodiment is a 2-input and 1-output C-element having two inputs which are a first input A, a second input B and one output which is an output O.

The C-element 11 is also called a rendezvous circuit, a join circuit or a last-of circuit.

When all inputs, namely, both inputs A, B are a logic "1", the output O will be a logic "1", whereas when all inputs, namely, both inputs A, B are the logic "0", the output O will be the logic "0".

The output O maintains the previous state in other conditions.

The element has a characteristics that the output O does not vary even when any one of the inputs A, B varies, and the output operates only when both inputs vary, that is because the element is called the rendezvous circuit.

Figure 1:
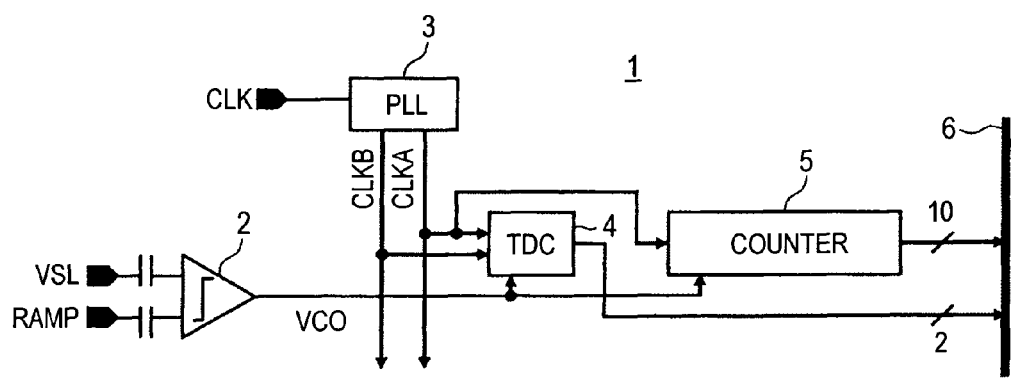
FIG. 1 is a diagram showing a configuration of an A/D converter in a system disclosed in Patent Document 1.
Figure 2A:
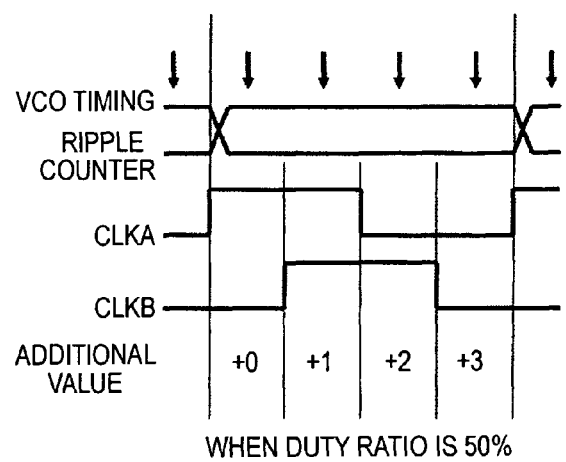
FIGS. 2A, 2B are diagrams for explaining the principle of a lower TDC which obtains resolution lower than a clock frequency.
Figure 2B:
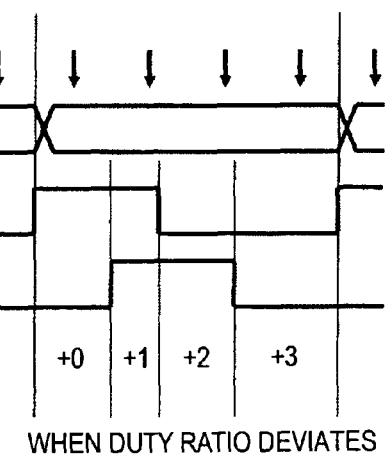
Figure 5B:
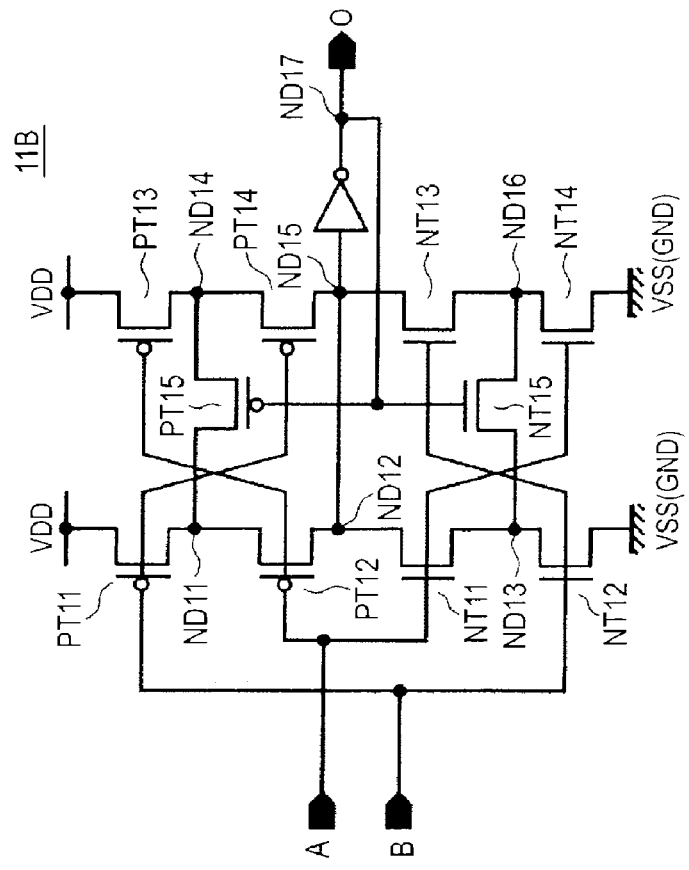
FIGS. 5A and 5B are circuit diagrams showing configuration examples of the C-element.
Figure 5A:
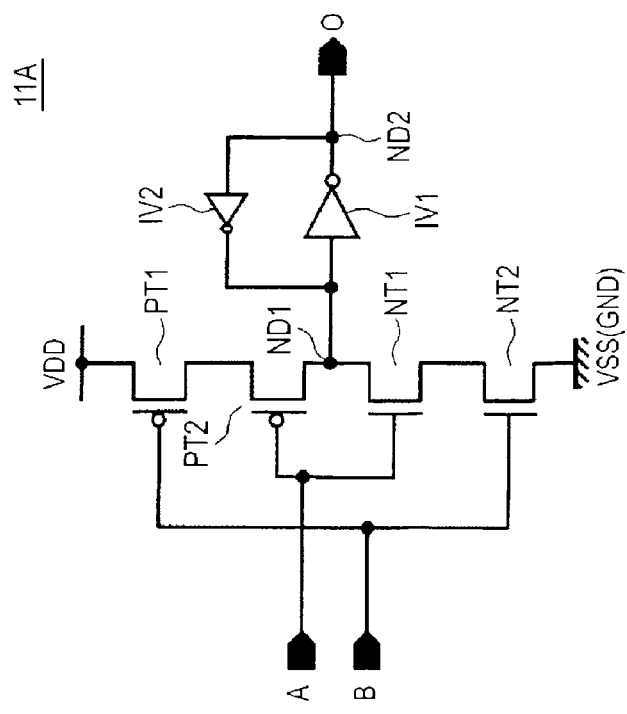

FIGS. 5A and 5B are circuit diagrams showing configuration examples of the C-element.

A C-element 11A of FIG. 5A includes PMOS transistors PT1, PT2, NMOS transistors NT1, NT2, inverters IV1, IV2, and nodes ND1, ND2.

A source of the PMOS transistor PT1 is connected to a power source potential VDD, and a drain is connected to a source of the PMOS transistor PT2.

A drain of the PMOS transistor PT2 is connected to a drain of the NMOS transistor NT1, and a connection point therebetween forms the node ND1.

A source of the NMOS transistor NT1 is connected to a drain of a NMOS transistor NT2, and a source of the NMOS transistor NT2 is connected to a reference potential VSS (for example, a ground GND).

A gate of the PMOS transistor PT2 and a gate of the NMOS transistor NT1 are connected to an input A, and a gate of the PMOS transistor PT1 and a gate of the NMOS transistor NT2 are connected to an input B.

The node ND1 is connected to an input of the inverter IV1 and an output of the inverter IV1 is connected to the node ND2. The node ND2 is connected to the output O and an input of the inverter IV2. An output of the inverter IV2 is connected to an input of the inverter IV1.

In the C-element 11A, when both inputs A, B are the logic "0", the PMOS transistors PT1, PT2 are turned on and the NMOS transistors NT1, NT2 are turned off.

As a result, the level of the node ND1 is changed to a power source potential level, namely, the level of the logic "1", and the level is inverted in the inverter IV1 to be the logic "0" at the node ND2, namely, at the output O.

When both inputs A, B are logic "1", the PMOS transistors PT1, PT2 are turned off and the NMOS transistors NT1, NT2 are turned on.

As a result, the level of the node ND1 is changed to a reference potential level, namely, the level of the logic "0", and the level is inverted in the inverter IV1 to be the logic "1" at the node ND2, namely, at the output O.

When the input A is the logic "0" and the input "B" is the logic "1", the PMOS transistor PT2 and the NMOS transistor NT2 are turned on, and the PMOS transistor PT1 and the NMOS transistor NT1 are turned off.

As a result, the node ND1 will be a floating node, and latched values formed in the inverters IV1, IV2 are maintained.

When the input A is the logic "1" and the input "B" is the logic "0", the PMOS transistor PT2 and the NMOS transistor NT2 are turned off, and the PMOS transistor PT1 and the NMOS transistor NT1 are turned on.

As a result, the node ND1 will be a floating node, and latched values formed in the inverters IV1, IV2 are maintained.

A C-element 11B of FIG. 5B includes PMOS transistors PT11 to PT15, NMOS transistors NT11 to NT15, an inverter IV11 and nodes ND11 to ND17.

A source of the PMOS transistor PT11 is connected to the power source potential VDD, a drain is connected to a source of the PMOS transistor PT12, a connection point therebetween forms the node ND11.

A drain of the PMOS transistor PT12 is connected to a drain of the NMOS transistor NT11, and a connection point therebetween forms the node ND12.

A source of the NMOS transistor NT11 is connected to a drain of the NMOS transistor NT12, and a connection point therebetween forms the ND13. A source of the NMOS transistor NT12 is connected to the reference potential VSS (for example, the ground GND).

A source of the PMOS transistor PT13 is connected to the power source potential VDD, a drain is connected to a source of the PMOS transistor PT14, and a connection point therebetween forms the node ND14.

A drain of the PMOS transistor PT14 is connected to a drain of the NMOS transistor NT13, and a connection point therebetween forms the node ND15.

A source of the NMOS transistor NT13 is connected to a drain of the NMOS transistor NT14, and a connection point therebetween forms the node ND16. A source of the NMOS transistor NT14 is connected to the reference potential VSS (for example the ground GND).

A source and a drain of the PMOS transistor PT15 are connected to the nodes ND11, ND14, and a source and a drain of the NMOS transistor NT15 are connected to the nodes ND13, ND16.

The nodes ND12, ND15 are connected to an input of the inverter IV11, and an output of the inverter IV11 is connected to the node ND17 connected to the output O, a gate of the PMOS transistor PT15 and a gate of the NMOS transistor NT15.

Gates of the PMOS transistor PT12, PT13 and gates of the NMOS transistors NT11, NT14 are connected to an input A.

Gates of the PMOS transistor PT11, PT14 and gates of the NMOS transistors NT12, NT13 are connected to an input B.

In the C-element 11B, when both inputs A, B are logic "0", the PMOS transistors PT11, PT12, PT13 and PT 14 are turned on and the NMOS transistors NT11, NT12, NT13 and NT14 are turned off.

As a result, the level of the node ND12 is changed to the power source potential level, namely, the level of the logic "1", and the level is inverted in the inverter IV11 to be the logic "0" at the node ND17, namely, at the output "O".

When both inputs A, Bare logic "1", the PMOS transistors PT11, PT12, PT13 and PT 14 are turned off and the NMOS transistors NT11, NT12, NT13 and NT14 are turned on.

As a result, the level of the node ND12 is changed to the reference potential level, namely, the level of the logic "0", and the level is inverted in the inverter IV11 to be the logic "1" at the node ND17, namely, at the output "O".

When the input A is the logic "0" and the input "B" is the logic "1", the PMOS transistors PT12, PT13 and the NMOS transistors NT12, NT13 are turned on, and the PMOS transistors PT11, PT14 and the NMOS transistors NT11, NT14 are turned off.

At this time, when the output O is the logic "1", the PMOS transistor PT15 is turned off and the NMOS transistor NT15 is turned on.

As a result, the level of the node ND15 is positively changed to the reference potential level, namely, the level of the logic "0" through the NMOS transistors NT13, NT15 and NT12, and the level is inverted in the inverter IV11 to be the logic "1" at the node ND17, namely, at the output O.

That is, the output O is maintained to be the logic "1".

When the output O is the logic "0", the PMOS transistor PT15 is turned on and the NMOS transistor NT15 is turned off.

As the result, the level of the node ND15 is positively changed to the power source potential level, namely, the level of the logic "1" through the PMOS transistors PT13, PT15, PT12 and the node ND12, and the level is inverted in the inverter IV11 to be the logic "0" at the node ND17, namely, at the output O.

That is, the output O is maintained to be the logic "0".

When the input A is the logic "1" and the input "B" is the logic "0", the PMOS transistors PT12, PT13 and the NMOS transistors NT12, NT13 are turned off, and the PMOS transistors PT11, PT14 and the NMOS transistors NT11, NT14 are turned on.

At this time, when the output O is the logic "1", the PMOS transistor PT15 is turned off and the NMOS transistor NT15 is turned on.

As the result, the level of the node ND15 is positively changed to the reference potential level, namely, the level of the logic "0" through the NMOS transistors NT12, NT15 and NT14, and the level is inverted in the inverter IV11 to be the logic "1" at the node ND17, namely, at the output O.

That is, the output O is maintained to be the logic "1".

When the output O is the logic "0", the PMOS transistor PT15 is turned on and the NMOS transistor NT15 is turned off.

As the result, the level of the node ND15 is positively changed to the power source potential level, namely, the level of the logic "1" through the PMOS transistors PT11, PT15, and PT14, and the level is inverted in the inverter IV11 to be the logic "0" at the node ND17, namely, at the output O.

That is, the output O is maintained to be the logic "0".

The C-element 11A of FIG. 5A has a configuration in which the number of transistors is the minimum as a static configuration.

Though the element can realize the circuit to be small size, there is a constraint that it is necessary that the feedback (FB) inverter IV1 of the latch circuit is designed to be relatively weak in drive performance.

The C-element 11B of FIG. 5B has a stable configuration which can be used as a logic element such as a normal NAND gate and a NOR gate without detailed care points in design though the number of transistors is increased as compared with FIG. 5A.

Next, the principle in which the duty correction circuit according to the embodiment corrects the duty ratio will be explained with reference to FIG. 6 and FIG. 7.

Figure 6:
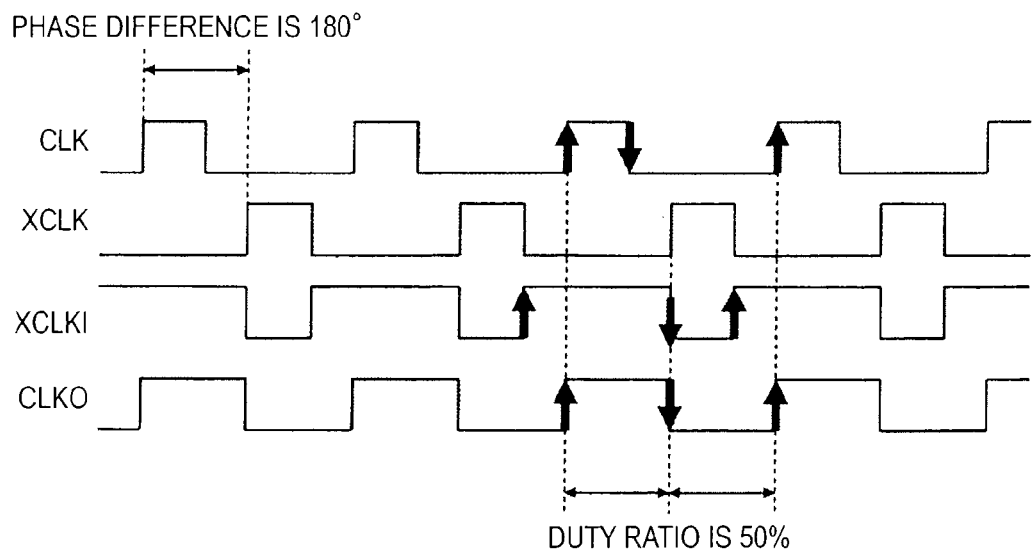
FIG. 6 is a diagram for explaining the correction principle when the duty ratio of the complementary clocks to be inputted is lower (thinner) than 50%.

FIG. 6 is a diagram for explaining the correction principle when the duty ratio of the complementary clocks to be inputted is lower (thinner) than 50%.

The input clocks CLK, XCLK as the complementary clocks have the phase difference of an approximately half cycle. That is, the phase difference between a rising edge of the clock CLK and a rising edge of the clock XCLK is almost 180 degrees.

The clock XCLK is logically inverted and the clock will be a clock XCLKI after passing through the inverter 12.

Accordingly, the phase difference between a rising edge of the input clock CLK and a falling edge of the inverted clock XCLKI is approximately 180 degrees.

Now, the output CLKO of the C-element 10 rises when both clocks CLK, XCLKI rise and falls when the both clocks fall.

When the duty ratio is low (thin), a factor determining the rising timing of the output clock CLKO is the rising edge of the input clock CLK.

That is, in the rising timings of the input clock CLK and the inverted clock XCLKI, the rising timing of the inverted clock XCLKI is earlier than the timing of the input clock CLK. A factor determining the falling timing of the output clock CLKO is the falling edge of the inverted clock XCLKI.

That is, in the falling timings of the input clock CLK and the inverted, clock XCLKI, the falling timing of the input clock CLK is earlier than the inverted clock XCLKI.

As described before, the phase difference between the rising edge of the input clock CLK and the falling edge of the inverted clock XCLKI is approximately 180 degrees.

Accordingly, the Hi-period of the output clock CLKO the rising and falling timings of which are determined by respective edges will be approximately 180 degrees, namely, a half cycle, as a result, the duty ratio is restored to 50%.

Figure 7:
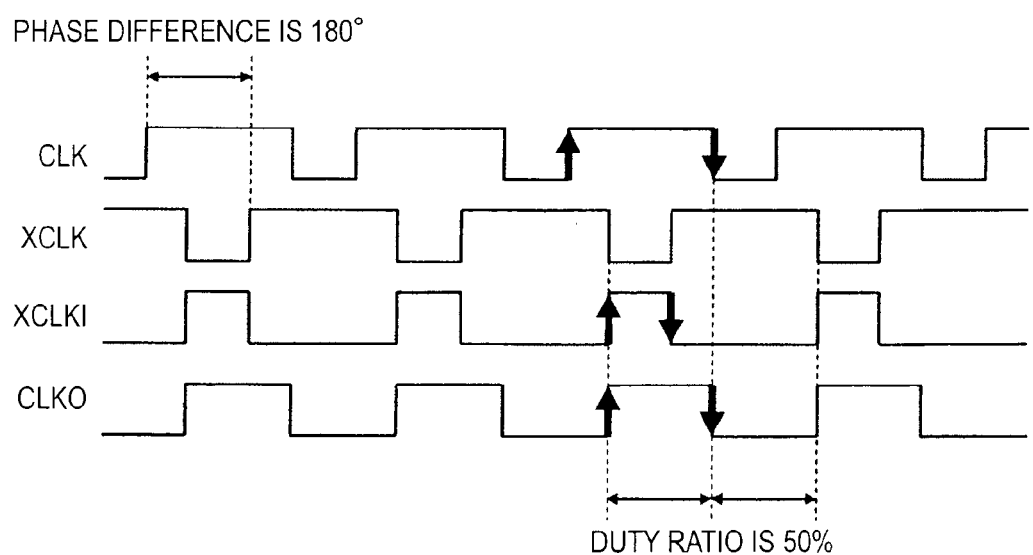
FIG. 7 is a diagram for explaining the correction principle when the duty ratio of the complementary clocks to be inputted is higher (thicker) than 50%.

FIG. 7 is a diagram for explaining the correction principle when the duty ratio of the complementary clocks to be inputted is higher (thicker) than 50%.

As described before, the input clocks CLK, XCLK as the complementary clocks have the phase difference, of an approximately half cycle.

The phase difference between a falling edge of the input clock CLK and a falling edge of the input clock XCLK is almost 180 degrees in the same manner as the rising edges.

The input clock XCLK is logically inverted and the clock will be the clock XCLKI after passing through the inverter 12.

Accordingly, the phase difference between the falling edge of the input clock CLK and the rising edge of the inverted clock XCLKI will be approximately 180 degrees.

Now, the output CLKO of the C-element 10 rises when both clocks CLK, XCLKI rise and falls when the both clocks fall in the same manner as the above.

When the duty ratio is high (thick), a factor determining the rising timing of the output clock CLKO is the rising edge of the inverted clock XCLKI.

That is, in the rising timings of the input clock CLK and the inverted clock XCLKI, the rising timing of the input clock CLK is earlier than the timing of the inverted clock XCLKI. A factor determining the falling timing of the output clock CLKO is the falling edge of the input clock CLK.

That is, in the falling timings of the input clock CLK and the inverted clock XCLKI, the falling timing of the inverted clock XCLKI is earlier than the input clock CLK.

As described before, the phase difference between the falling edge of the input clock CLK and the rising edge of the inverted clock XCLKI is approximately 180 degrees.

Accordingly, the Hi-period of the output clock CLKO the falling and rising timings of which are determined by respective edges will be approximately 180 degrees, namely, a half cycle, as a result, the duty ratio is restored to 50%.

According to the first embodiment, the duty ratio can be corrected to 50% with a simple circuit.

Most of semiconductor integrated circuits apply a synchronization system using clocks, therefore, the invention has large ripple effect.

2. Second Embodiment

[Second Configuration Example of the Duty Correction Circuit]

Figure 8:
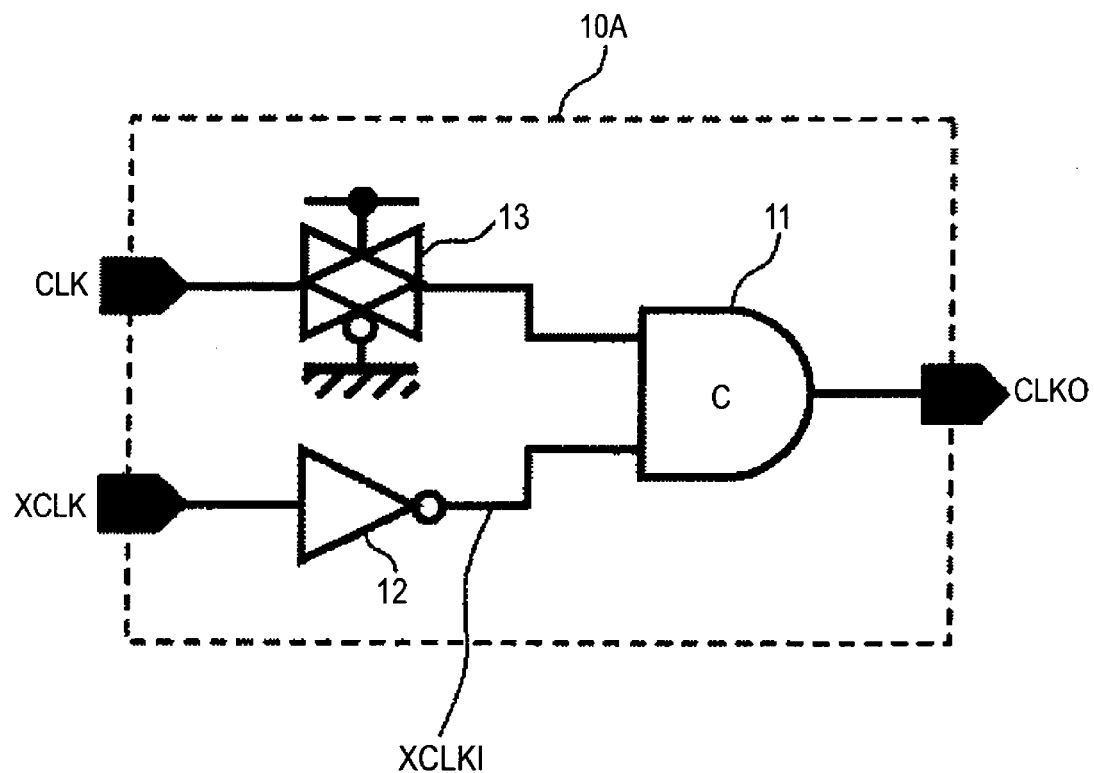
FIG. 8 is a diagram showing a configuration example of a duty correction circuit according to a second embodiment of the invention.

FIG. 8 is a diagram showing a configuration example of a duty correction circuit according to a second embodiment of the invention.

A duty correction circuit 10A according to the second embodiment of the invention differs from the duty correction circuit 10 according to the first embodiment in a point that a pass-gate capacitor 13 is connected to a first input of the C-element 11 to which the inverter 12 is not connected.

Though the duty correction circuit 10 of the first embodiment can correct the duty ratio to approximately 50% in principle, delay of the inverter 12 may cause an error.

The pass-gate capacitor 13 is designed to have approximately the same delay as the inverter 12 in order to remove the error amount included in the correction circuit itself, which gives the circuit more accurate duty correction effect.

[Application Examples of the Duty Correction Circuit]

Hereinafter, application examples of the duty correction circuit according to the embodiments will be explained.

3. Third Embodiment

[First Example of the Duty Correction Circuit Applied to a DLL Circuit]

Figure 9:
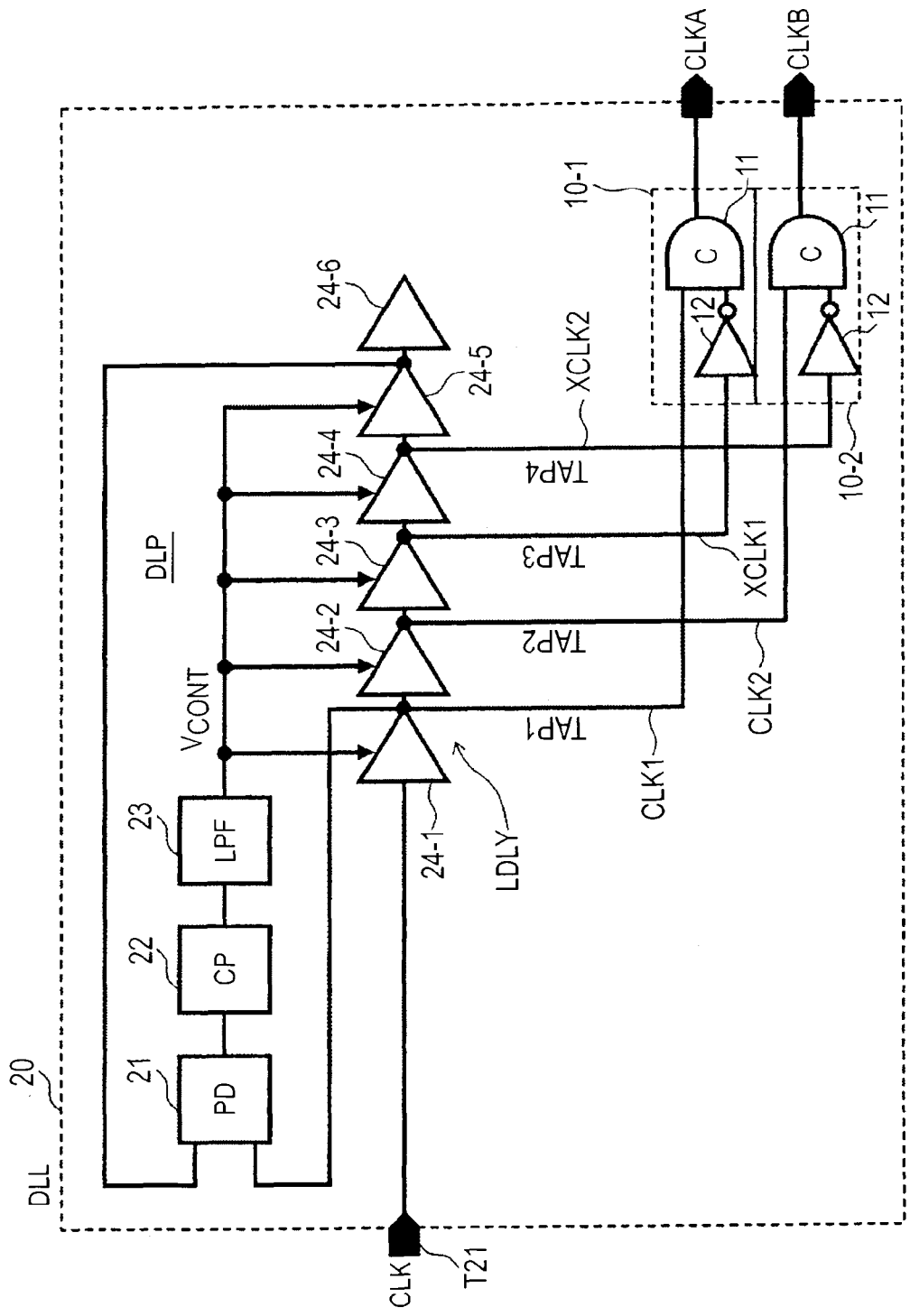
FIG. 9 is a diagram showing a configuration example of a DLL circuit according to a third embodiment of the invention.

FIG. 9 is a diagram showing a configuration example of a DLL circuit according to a third embodiment of the invention.

The above duty correction circuit 10 is applied to a DLL circuit (Delay Locked Loop) circuit 20. That is, the DLL circuit 20 is configured as a DLL circuit with the duty correction function.

The DLL circuit is a circuit for controlling delay time of an external interface generated due to wiring load and so on to adjust synchronization with an internal clock.

The DLL circuit 20 includes a phase detector (PD) 21, a charge pump (CP) 22, a low-pass filter (LPF) 23 and delay elements 24-1 to 24-6 connecting in cascade to an input terminal T21 of the clock CLK.

The DLL circuit 20 includes duty correction circuits 10-1, 10-2.

The DLL circuit is different from the PLL circuit, which has a characteristic in which the input clock CLK with a deviated duty ratio will be outputted as it is.

In the embodiment, the disadvantage of the DLL circuit is solved by mounting the above duty correction circuit.

In the example of FIG. 9, a closed loop includes four-stages of delay elements 24-1, 24-2, 24-3 and 24-4, in which the phase difference of clocks at respective output-side taps TAP1, TAP2, TAP3 and TAP4 is 90 degrees.

The DLL circuit 20 is locked by performing delay synchronization in a delay loop DLP including the charge pump 22 and the low-pass filter 23 by comparing the phase difference between an original signal and a signal delayed for one cycle through a delay line LDLY in which delay elements are connected in cascade in the phase detector 21.

Accordingly, when the delay line LDLY is configured by even plural stages, a combination of taps TAP in which the phase difference is 180 degrees definitely exists.

In the example, there exist a combination of the tap TAP1 and the tap TAP3 and a combination of the tap TAP2 and the TAP4.

When the signal pairs as combinations are inputted to the duty correction circuits 10-1, 1-2 to take out outputs, clocks CLKA, CLKB with the corrected duty ratio are outputted.

FIG. 10 is a diagram showing operation waveforms of the DLL circuit of FIG. 9 when the duty ratio of the inputted complementary clocks is lower (thinner) than 50%.

FIG. 11 is a diagram showing operation waveforms of the DLL circuit of FIG. 9 when the duty ratio of the inputted complementary clocks is higher (thicker) than 50%.

FIG. 10 corresponds to FIG. 6 and FIG. 11 corresponds to FIG. 7.

In FIG. 10 and FIG. 11, a CLK1 of the tap TAP1 corresponds to the input clock CLK of FIG. 6 and a clock XCLK1 of the tap TAP3 corresponds to the input clock XCLK of FIG. 6.

Then, the clock CLK1 of the tap TAP1 is supplied to one input of the C-element 11 of the duty correction circuit 10-1. The clock XCLK1 of the tap TAP3 is supplied to the inverter 12 of the duty correction circuit 10-1.

In the same manner, in FIG. 10 and FIG. 11, a clock CLK2 of the tap TAP2 corresponds to the input clock CLK of FIG. 6 and a clock XCLK2 of the tap TAP4 corresponds to the input clock XCLK of FIG. 6.

Then, the clock CLK2 of the tap TAP4 is supplied to one input of the C-element 11 of the duty correction circuit 10-2. The clock XCLK2 of the tap TAP4 is supplied to the inverter 12 of the duty correction circuit 10-2.

The clock CLK1 of the tap TAP1 is supplied to one input of the C-element 11 of the duty correction circuit 10-1 and the clock XCLK1 of the tap TAP3 is supplied to the inverter 12 of the duty correction circuit 10-1, as a result, an output clock CLKA with the corrected duty ratio can be obtained.

The clock CLK2 of the tap TAP2 is supplied to one input of the C-element 11 of the duty correction circuit 10-2 and the clock XCLK2 of the tap TAP4 is supplied to the inverter 12 of the duty correction circuit 10-2, as a result, an output clock CLKB with the corrected duty ratio can be obtained.

The duty correction operation is based on the same operation principle as the one described with reference to FIG. 6 and FIG. 7.

Therefore, the explanation thereof is omitted here.

As described above, it is possible to output signals with the duty ratio of approximately 50% in the DLL circuit 20 not depending on the duty ratio of the input signal.

4. Fourth Embodiment

[Second Example of the Duty Correction Circuit Applied to the DLL Circuit]

Figure 12:
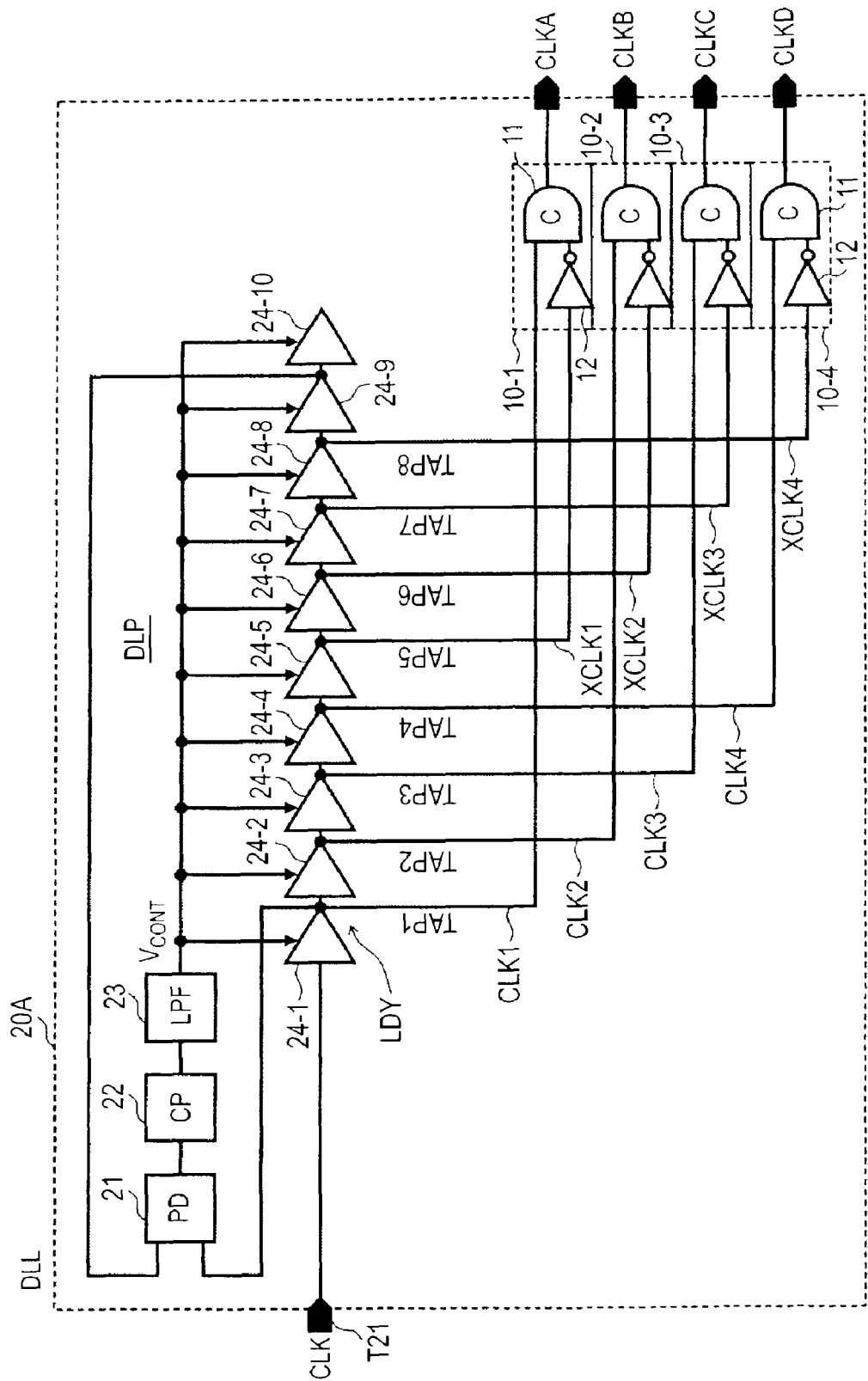
FIG. 12 is a diagram showing a configuration example of a DLL circuit according to a fourth embodiment of the invention.

FIG. 12 is a diagram showing a configuration example of a DLL circuit according to a fourth embodiment of the invention.

A DLL circuit 20A according to the fourth embodiment differs from the DLL circuit 20 according to the third embodiment in a point that 10 delay elements 24-1 to 24-10 are connected in cascade to configure the closed loop including eight-stages of delay elements 24-1 to 24-8.

In response to the above, two duty correction circuits 10-3, 10-4 are added in the DLL circuit 20A.

In this case, the phase difference of clocks at respective output-side taps TAP1 to TAP8 of the delay elements 24-1 to 24-8 is 45 degrees.

In the same manner as the above, combinations of taps TAP having the phase difference of 180 degrees are inputted to the duty correction circuits 10-1 to 10-4, thereby obtaining the effect of duty correction, though waveforms are not particularly shown here.

In the example, combinations can be made between the tap TAP1 and the tap TAP5, between the tap TAP2 and the tap TAP6, between the tap TAP3 and the tap TAP7 and between the tap TAP4 and the tap TAP8.

The clock CLK1 of the tap TAP1 is supplied to one input of the C-element 11 of the duty correction circuit 10-1 and the clock XCLK1 of the tap TAP5 is supplied to the inverter 12 of the duty correction circuit 10-1, as a result, an output clock CLKA with the corrected duty ratio can be obtained.

The clock CLK2 of the tap TAP2 is supplied to one input of the C-element 11 of the duty correction circuit 10-2 and the clock XCLK2 of the tap TAP6 is supplied to the inverter 12 of the duty correction circuit 10-2, as a result, an output clock CLKB with the corrected duty ratio can be obtained.

The clock CLK3 of the tap TAP3 is supplied to one input of the C-element 11 of the duty correction circuit 10-3 and the clock XCLK3 of the tap TAP7 is supplied to the inverter 12 of the duty correction circuit 10-3, as a result, an output clock CLKC with the corrected duty ratio can be obtained.

The clock CLK4 of the tap TAP4 is supplied to one input of the C-element 11 of the duty correction circuit 10-4 and the clock XCLK4 of the tap TAP8 is supplied to the inverter 12 of the duty correction circuit 10-4, as a result, an output clock CLKD with the corrected duty ratio can be obtained.

The number of stages of the delay line LDLY is not limited to four stages or eight stages but may be stages in even numbers.

5. Fifth Embodiment

[First Example of the Duty Correction Circuit Applied to a Column A/D Converter]

Figure 13:
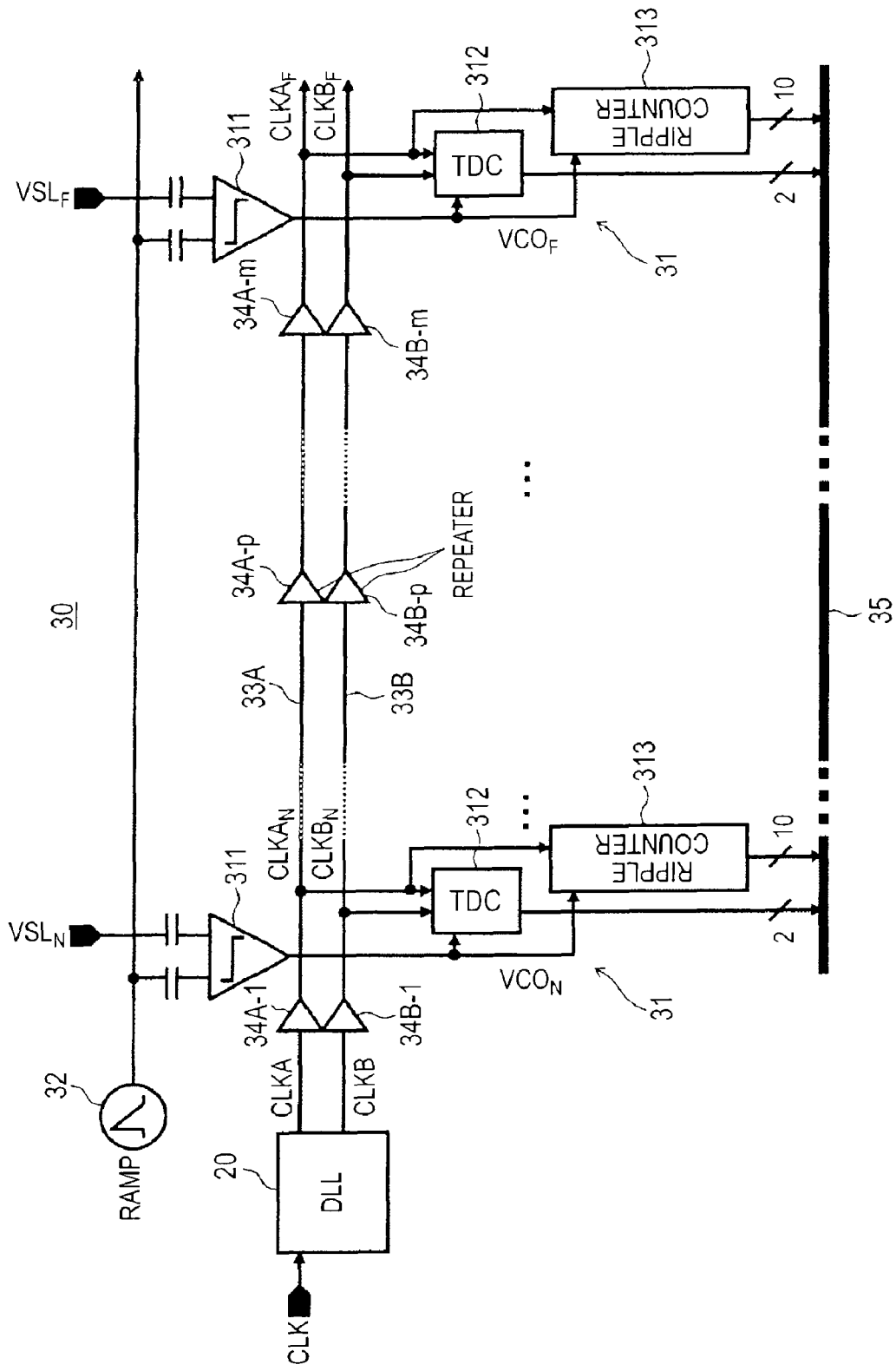
FIG. 13 is a diagram showing a configuration example of a column A/D converter in which integrating-type A/D converters are aligned in column parallel according to a fifth embodiment of the invention.

FIG. 13 is a diagram showing a configuration example of a column A/D converter in which integrating-type A/D converters are aligned in column parallel according to a fifth embodiment of the invention.

The DLL circuit 20 to which the above duty correction circuit 10 is mounted is applied to the column A/D converter 30.

Plural integrating-type A/D converters 31 are aligned in column parallel in the column A/D converter 30. The column A/D converter 30 includes the following components in addition to the DLL circuit 20 and plural integrating-type A/D converters 31.

The column. A/D converter 30 includes a ramp generation unit 32 generating ramp waveforms, clock transfer lines 33A, 33B, repeaters 34A-1 to 34A-m, 34B-1 to 34B-m and a transfer bus 35.

Each integrating-type A/D converter 31 includes a comparator 311, a TDC (Time-to-Digital Converter for latching and decoding) 312, a higher counter (ripple counter) 313.

The converter has resolution of total 12-bits obtained by adding 10-bit in the higher counter 313 to 2-bit in the lower TDC 312 by using two clock signals CLKA, CLKB whose phases by the DLL circuit 20 are different by 90 degrees with the corrected duty ratio.

A reference voltage RAMP having a ramp waveform in which a voltage value linearly varies with time is compared to an input voltage VSL with the comparator 311, and the compared result is outputted as a signal VCO.

The higher counter 313 starts or stops operations at the timing when the signal VCO varies, and the lower TDC 312 latches information of clock signals having different phases.

The column A/D converter 30 is used for reading pixel signals of an image sensor in column parallel.

In the column A/D converter 30, the clocks CLKA, CLKB having different phases are transmitted from one side of the clock transfer lines 33A, 33B through all columns by the DLL circuit 20 with the duty correction function.

A column positioned near the DLL circuit is referred to as a near-end column and a column positioned far from the DLL circuit is referred to as a far-end column.

The duty ratio of the clock inputted to the DLL circuit 20 can be corrected by applying the DLL circuit 20 with the duty correction function.

As the clock inputted to the DLL circuit 20 has been passed various paths in the chip, there is a case in which the duty ratio thereof has deviated before being distributed to the column A/D converter.

To correct the clock by the DLL circuit 20 with the duty correction function at the stage of an entrance of the A/D converter obviates the need for considering the duty deviation occurred at precious paths, as a result, characteristics of A/D conversion can be improved.

6. Sixth Embodiment

[An Example of the Duty Correction Circuit Applied to a Transfer Line]

Figure 14:
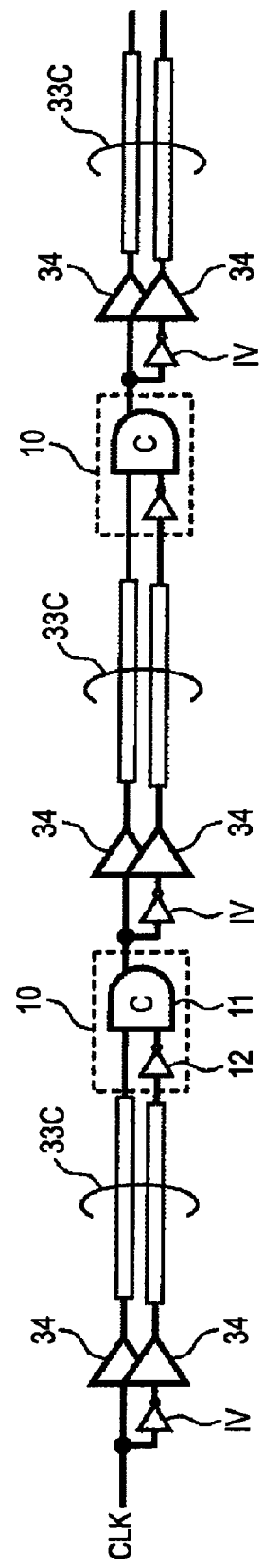
FIG. 14 is a diagram showing an example of applying the duty correction circuit to a clock transfer line according to a sixth embodiment of the invention.

FIG. 14 is a diagram showing an example of applying the duty correction circuit to the clock transfer line according to a sixth embodiment of the invention.

FIG. 14 shows a clock transfer line 33C through which the clock is propagated by using the complementary clocks.

When the clock CLK is propagated through wiring for a long distance, the duty ratio deviates while passing through repeaters by being affected by resistance of wiring or parasitic capacitance.

Accordingly, the clock CLK is transmitted in a complementary manner. The duty ratios of the complementary clocks respectively deviate, however, the phase difference is maintained to approximately 180 degrees in paths arranged side by side or when passing through the same circuit.

Accordingly, the duty correction circuit 10 according to the embodiment is inserted just before the clock is inputted to the repeater 34, thereby correcting the duty ratio at any time.

7. Seventh Embodiment

[Second Example of the Duty Correction Circuit Applied to the Column A/D Converter]

Figure 15:
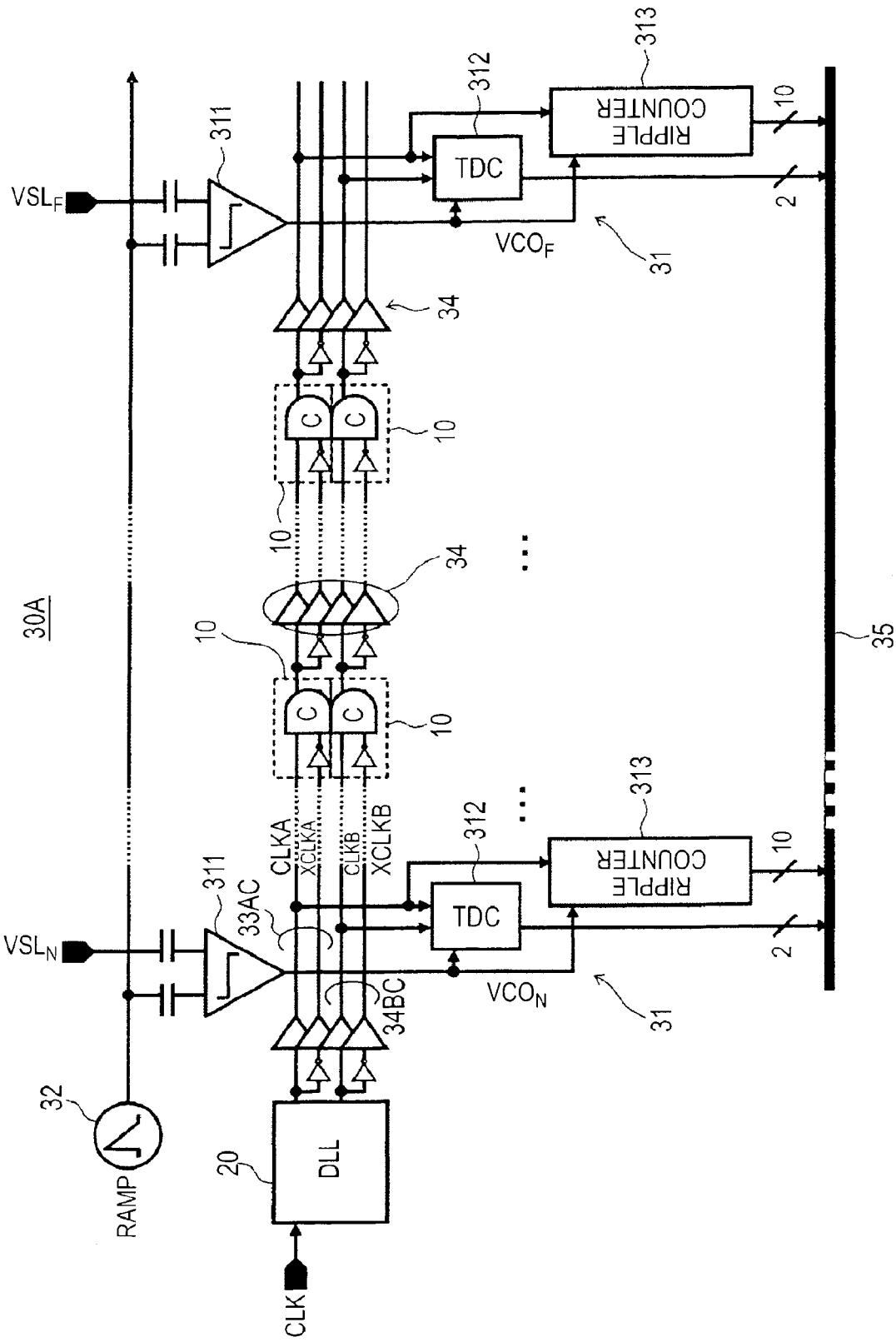
FIG. 15 is a diagram showing a configuration example of a column A/D converter in which integrating-type A/D converters are aligned in column parallel according to a seventh embodiment of the invention.

FIG. 15 is a diagram showing a configuration example of a column A/D converter in which integrating-type A/D converters are aligned in column parallel according to a seventh embodiment of the invention.

The configuration of the clock transfer line according to the sixth embodiment is applied to a column A/D converter 30A according to the seventh embodiment of the invention.

That is, in the column A/D converter 30A according to the seventh embodiment, complementary clock transfer lines 33AC, 33BC are applied, in which the duty correction circuit 10 is arranged at respective input stages of the repeaters 34A, 34B.

The example has a characteristic that the duty ratio does not deviate so much even at the far end because the duty ratio of the clock is corrected at any time.

A case in which the duty correction circuit is not arranged at respective input stages of the repeaters 34A, 34B will be considered here.

The clocks CLKA, CLKB are propagated through the repeaters 34A, 34B.

At this time, the duty ratio deviates due to the time difference between the rising time and the falling time, and the duty ratio differs between clock signals CLKAN, CLKBN at the near end and the clock signals CLKAF, CLKBF at the far end, which may reduce A/D conversion characteristics.

In response to this, the duty correction circuit 10 is arranged at respective input stages of the repeaters 34A, 34B in the seventh embodiments, therefore, there is an advantage that the reduction of A/D conversion characteristics can be suppressed by allowing effects due to deviation of the duty ratio at the repeaters to be minimum.

The DLL circuit 20 can effectively suppress the reduction of A/D conversion characteristics by preferably including the duty correction function.

However, the reduction of A/D conversion characteristics can be sufficiently suppressed even when the DLL circuit 20 does not have the duty correction function.

8. Eighth Embodiment

[Third Example of the Duty Correction Circuit Applied to the Column A/C Converter]

Figure 16:
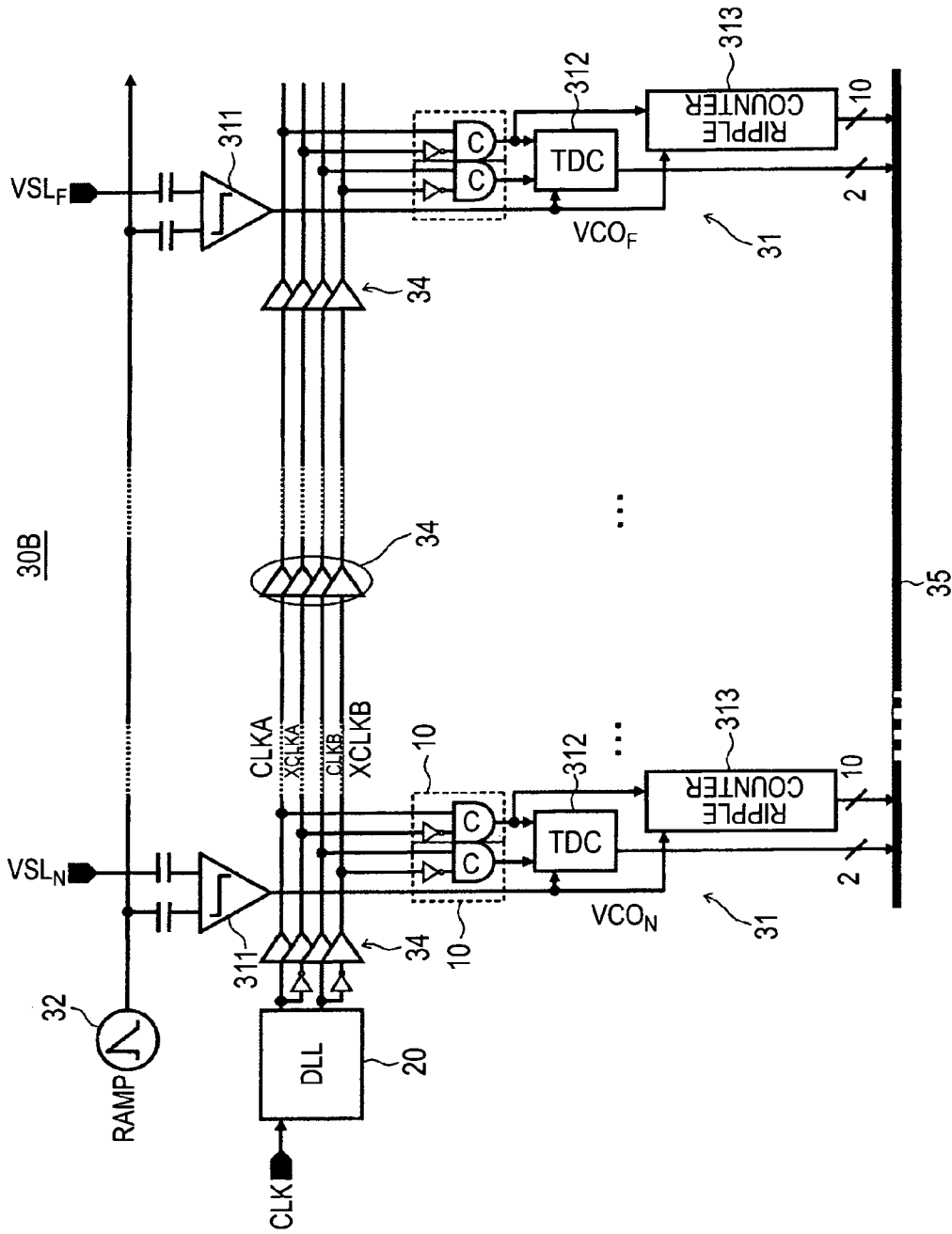
FIG. 16 is a diagram showing a configuration example of a column A/D converter in which integrating-type A/D converters are aligned in column parallel according to an eighth embodiment of the invention.

FIG. 16 is a diagram showing a configuration example of a column A/D converter in which integrating-type A/D converters are aligned in column parallel according to an eighth embodiment of the invention.

A column A/D converter 30B according to the eighth embodiment differs from the A/D converter 30A according to the seventh embodiment in the following point.

In the column A/D converter 30B according to the eighth embodiment, the duty correction circuit 10 is arranged in input stages of the TDC 312 and the higher bit counter 313 of each integrating-type A/D converters 31, not at complementary clock transfer lines 33AC, 33BC.

According to the eighth embodiment, since there is provided the duty correction circuit 10 just before latching phase difference information at each TDC 312 of each integrating A/D converter 31, the correction can be effectively made.

According to the fifth, the seventh and the eighth embodiments, characteristics of the column-parallel A/D converter, the upper limit or DNL of the operation frequency can be improved.

The configurations of the fifth, the seventh and eight embodiments can be applied independently as well as applied by being combined appropriately.

9. Ninth Embodiment

[Whole Configuration Example of a Solid-State Imaging Device]

Figure 17:
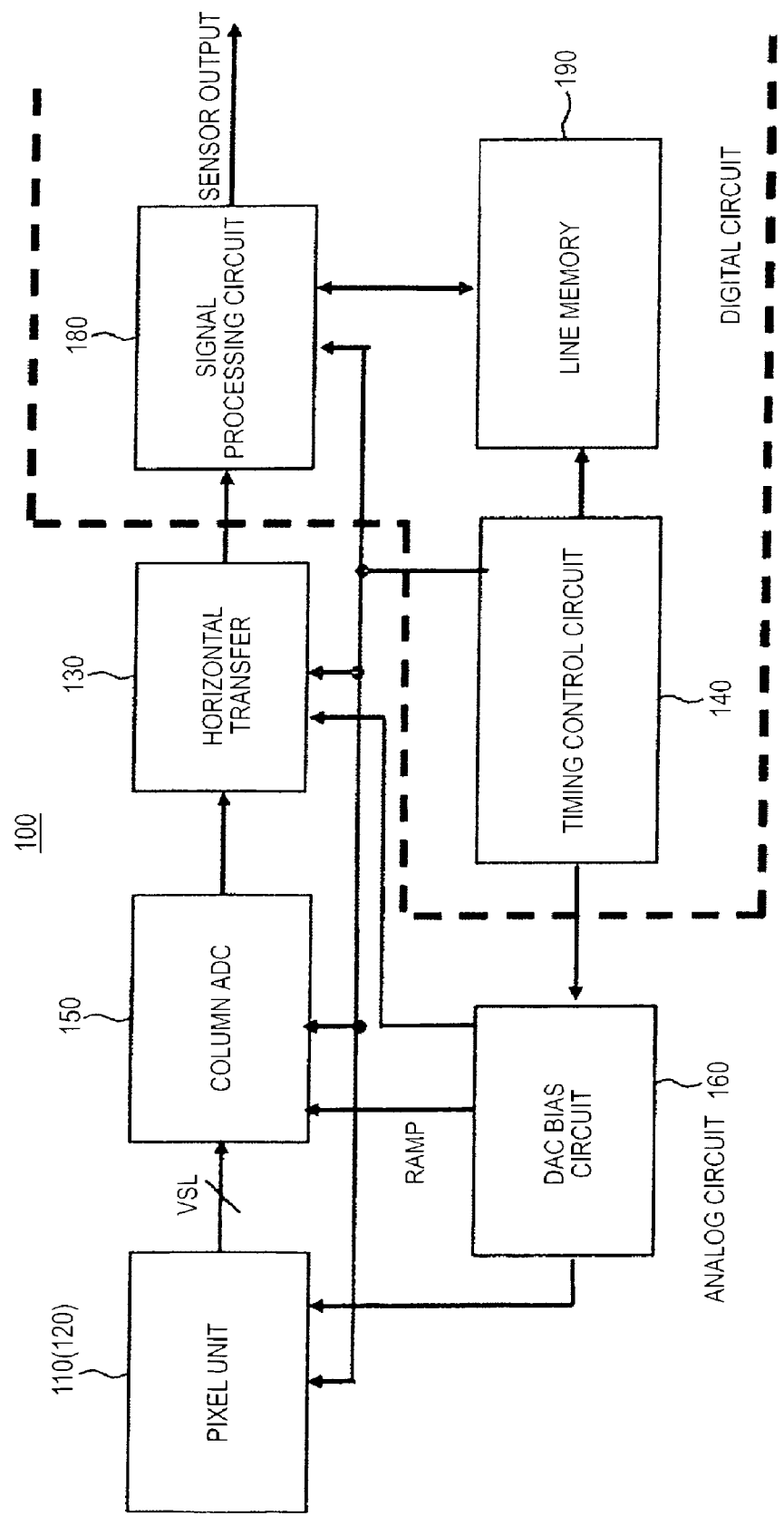
FIG. 17 is a block diagram showing a configuration example a solid-state imaging device (CMOS image sensor) with the column-parallel A/D converter according to a ninth embodiment of the invention.

FIG. 17 is a block diagram showing a configuration example of a solid-state imaging device (CMOS image sensor) with the column-parallel ADC according to a ninth embodiment of the invention.

Figure 18:
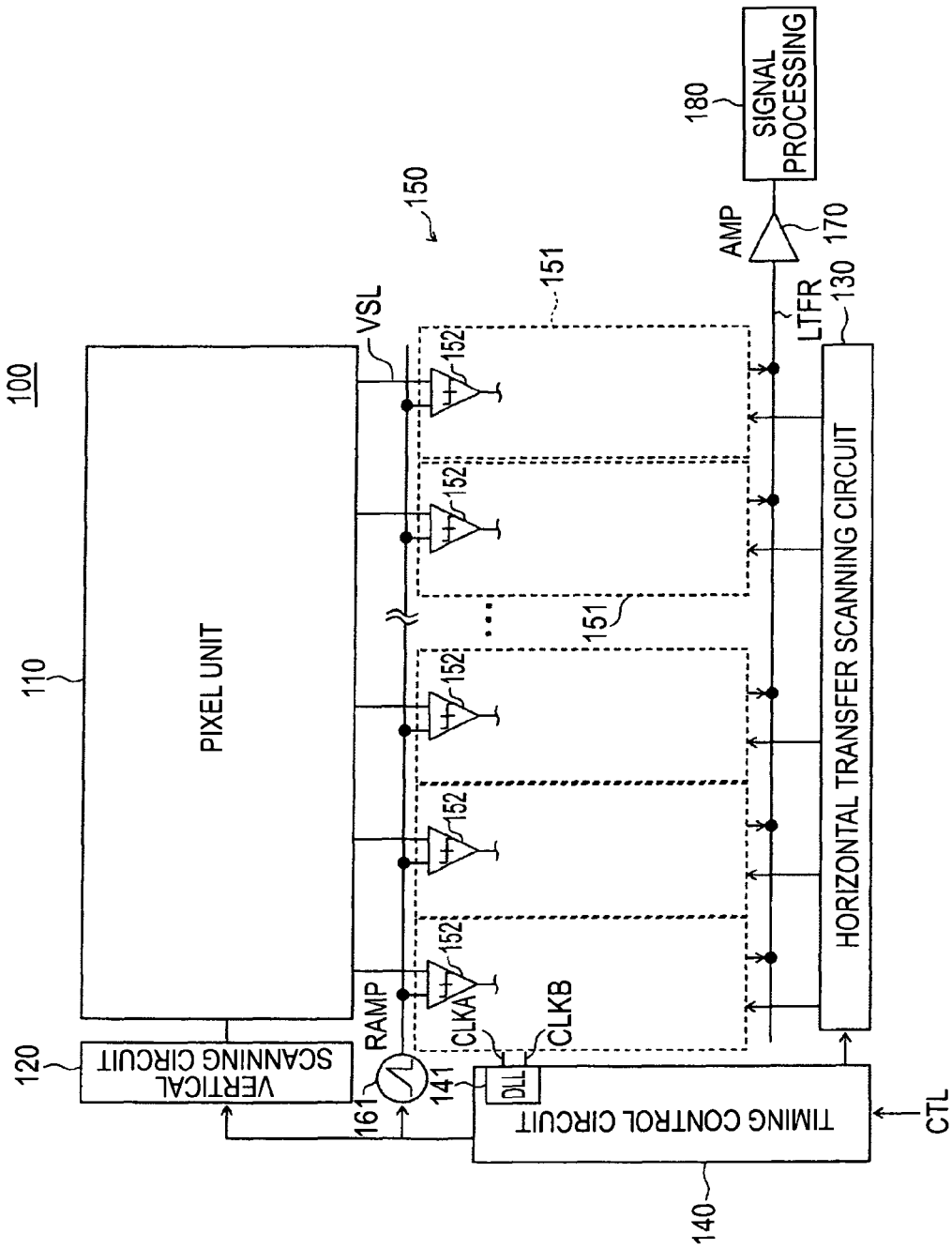
FIG. 18 is a block diagram specifically showing a relevant part in the solid-state imaging device (CMOS image sensor) with the column-parallel A/D converter of FIG. 17.

FIG. 18 is a block diagram specifically showing a relevant part in the solid-state imaging device (CMOS image sensor) with the column-parallel ADC of FIG. 17.

A solid-state imaging device 100 includes a pixel unit 110 as an imaging unit, a vertical scanning circuit 120, a horizontal transfer scanning circuit 130, a timing control circuit 140 and a column A/D converter (ADC) 150 as a pixel signal reading unit, as shown in FIG. 17 and FIG. 18. The pixel signal reading unit is configured by including the vertical scanning circuit 120 and the like.

The solid-state imaging device 100 has a DAC bias circuit 160 including a D/A converter 161, an amplifier circuit (S/A) 170, a signal processing circuit 180 and a line memory 190.

In the above components, the pixel unit 110, the vertical scanning circuit 120, the horizontal transfer scanning circuit 130, the column A/D converter (ADC) 150, the DAC bias circuit 160, and the amplifier circuit (S/A) 170 are formed by analog circuits.

The timing control circuit 140, the signal processing circuit 180 and the line memory 190 are formed by digital circuits.

As the column A/D converter 150, the column A/D converters 30, 30A, 30B according to the fifth, the seventh and the eighth embodiments are applied. In FIG. 18, only comparators 152 are shown in respective integrating-type A/D converters 151 for simplifying the drawing.

As the integrating-type A/D converter 151, the integrating-type A/D converters 31, 31A and 31B of the column A/D converters 30, 30A, 30B according to the fifth, the seventh and the eighth embodiments are applied.

A DLL circuit 141 in the timing control circuit 140 corresponds to the DLL circuit 20 of the embodiment.

The D/A converter 161 corresponds to the ramp generation unit 32 of FIG. 13, FIG. 15 and FIG. 16.

In the pixel unit 110, pixels each having a photodiode and a pixel amplifier are arranged in a matrix state.

Figure 19:
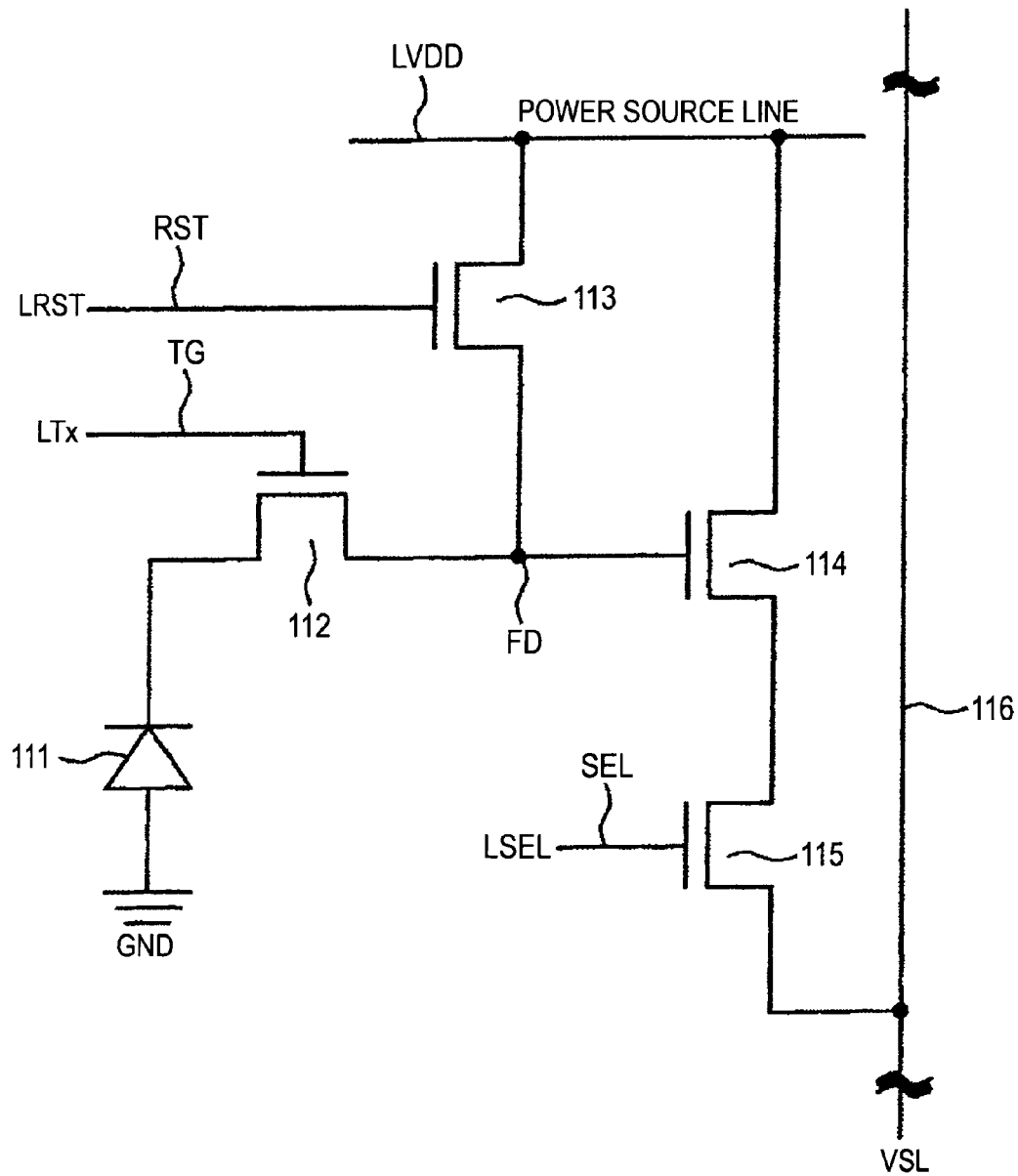
FIG. 19 is a diagram showing an example of a pixel of the CMOS image sensor including four transistors according to the embodiment.

FIG. 19 is a diagram showing an example of the pixel of the CMOS image sensor including four transistors according to the embodiment.

A pixel circuit 101A includes, for example, a photodiode 111 as a photoelectric conversion element.

The pixel circuit 101A includes the photodiode 111 as one photoelectric conversion element.

The pixel circuit 101A includes four transistors as active elements, which are a transfer transistor 112 as a transfer element, a reset transistor 113 as a reset element, an amplifier transistor 114 and a selection transistor 115 with respect to one photodiode 111.

The photodiode 111 photoelectrically converts incident light into charges (electrons in this case) corresponding to the light amount.

The transfer transistor 112 is connected between the photodiode 111 and a floating diffusion FD as an output node.

The transfer transistor 112 transfers electrons photoelectrically converted by the photodiode 111 to the floating diffusion FD when a drive signal TG is given to a gate (transfer gate) of the transistor through a transfer control line LTx.

The reset transistor 113 is connected between a power source line LVDD and the floating diffusion FD.

The reset transistor 113 resets a potential of the floating diffusion FD to a potential of the power source line LVDD when a reset RST is given to a gate of the transistor through a reset control line LRST.

A gate of the amplifier transistor 114 is connected to the floating diffusion FD. The amplifier transistor 114 is connected to a vertical signal line 116 through the selection transistor 115, which configures a source follower with a constant current source which is outside the pixel.

Then, a control signal (an address signal or a select signal) SEL is given to a gate of the selection transistor 115 through a selection control line LSEL to turn on the selection transistor 115.

When the selection transistor 115 is turned on, the amplifier transistor 114 amplifies the potential of the floating diffusion FD and outputs the voltage corresponding to the potential to the vertical signal line 116. The voltage outputted from each pixel is outputted to the column A/D converter 150 as a pixel signal reading circuit through the vertical signal line 116.

These operations are performed in respective pixels of one row at the same time because respective gates of, for example, the transfer transistor 112, the reset transistor 113 and the selection transistor 115 are connected in each row.

The reset control line LRST, the transfer control line LTx and the selection control line LSEL arranged as a set in the pixel unit 110 are wired in each row of pixel arrangement.

These reset control line LRST, the transfer control line LTx and the selection control line LSEL are driven by the vertical scanning circuit 120 as a pixel drive unit.

In the solid-state imaging device 100, the timing control circuit 140 generating an internal clock as a control circuit for sequentially reading signals of the pixel unit 110, the vertical scanning circuit 120 controlling row addresses and row scanning, and the horizontal transfer scanning circuit 130 controlling column addresses and column scanning are arranged.

The timing control circuit 140 generates timing signals necessary for signal processing in the pixel unit 110, the vertical scanning circuit 120, the horizontal transfer scanning circuit 130, the column A/D converter 150, the DAC bias circuit 160, the signal processing circuit 180 and the line memory 190.

In the pixel unit 110, video or screen images are photoelectrically converted by each pixel row by accumulation and discharge of photons using, for example, a line shutter, and analog signals VSL are outputted to the column A/D converter 150.

In the column A/D converter 150, analog outputs from the pixel unit 100 are converted by integrating-type A/D converters 151 using the reference voltage RAMP from the DAC 161 at ADC blocks (respective column units) respectively as well as digital CDS is performed to output digital signals of several bits.

Figure 20:
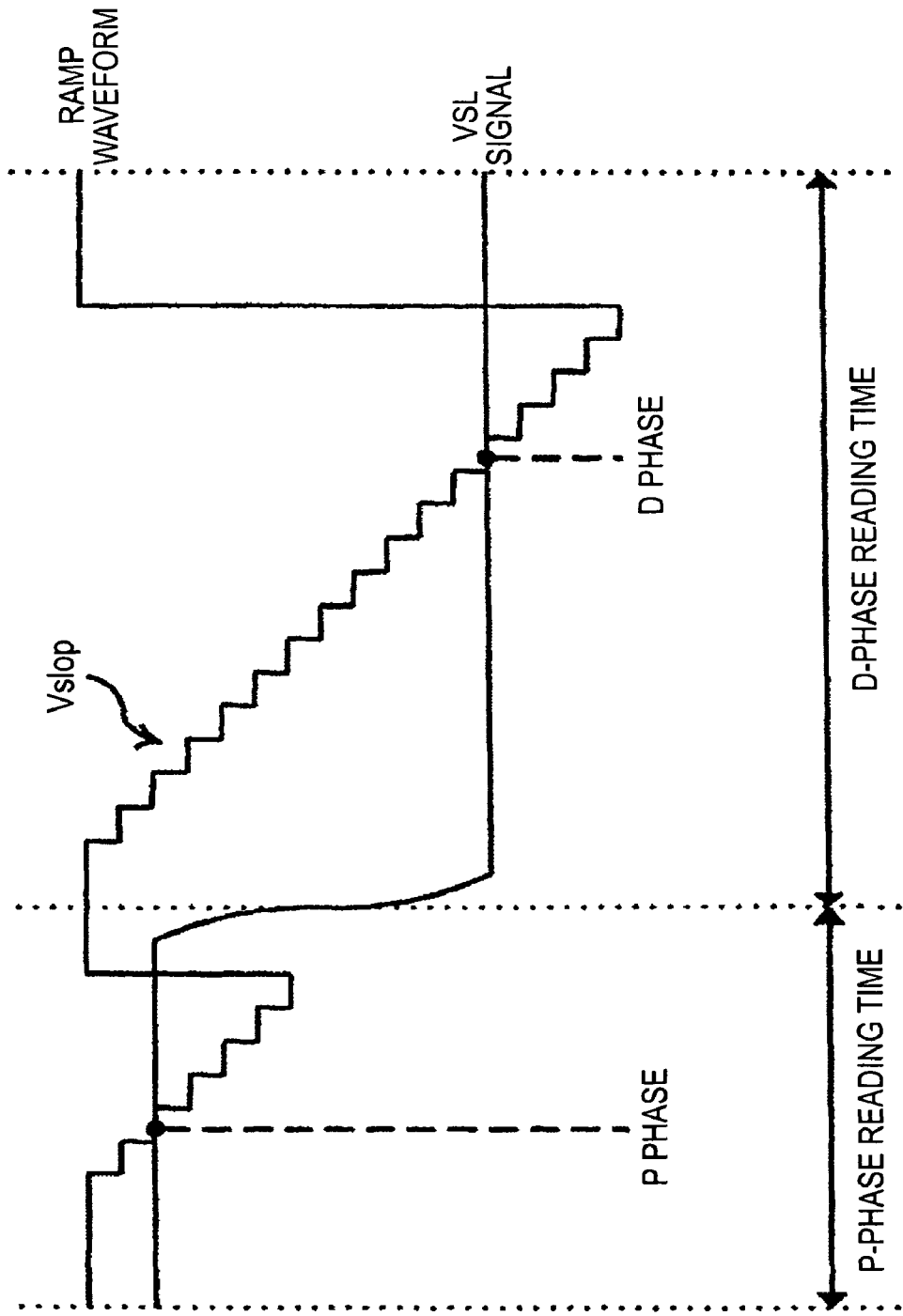
FIG. 20 is a view showing an example of a ramp (RAMP) waveform generated by the D/A converter and of operation timing of the A/D converter.

FIG. 20 is a view showing an example of the ramp (RAMP) waveform generated by the DAC and of operation timing of the ADC.

The DAC 161 generates the reference voltage RAMP which is the sloped ramp (RAMP) waveform varying in a staircase pattern as shown in FIG. 20.

The column A/D converter 150 has the same configuration and functions as the column A/D converters 30, 30A, 30B according to the fifth, the seventh and the eighth embodiments, therefore, the explanation thereof is omitted.

Outputs of respective integrating A/D converters 151 are connected to horizontal transfer lines LTRF.

Then, k-pieces of amplifier circuits 170 corresponding to the horizontal transfer lines LTRF and the signal processing circuit 180 are arranged.

After the above AD conversion period has been completed, data by a logic circuit 155 is transferred to the horizontal transfer lines LTRF by the horizontal transfer scanning circuit 130 and inputted to the signal processing circuit 180 through the amplifier circuits 170 to generate a two-dimensional image through given signal processing.

In the horizontal transfer scanning circuit 130, multichannel-simultaneous parallel transfer is performed for securing transfer speed.

In the timing control circuit 140, timings necessary for signal processing of respective blocks such as the pixel unit 110 and the A/D converter 150 are generated.

In the signal processing circuit 180 in the subsequent stage, correction of vertical line defects or dot defects and signal clamping are performed by signals stored in the line memory 190 as well as digital signal processing such as parallel/serial conversion, compression, encoding, addition, average and intermittent operation is performed.

Digital signals transmitted to respective pixel rows are stored in the line memory 190.

In the solid-state imaging device 100 according to the embodiment, digital outputs of the signal processing circuit 180 are transmitted as inputs for an ISP or a baseband (base band) LSI.

The CMOS image sensor 100 as a solid-state imaging device according to the ninth embodiment applies the column A/D converters 30, 30A and 30B according to the fifth, the seventh and the eighth embodiments.

Therefore, characteristics of the column-parallel A/D converter, the upper limit or DNL of the operation frequency can be improved according to the solid-state imaging device.

The solid-state imaging device having the above advantages can be applied as an imaging device of a digital camera or a video camera.

10. Tenth Embodiment

[Configuration Example of a Camera System]

Figure 21:
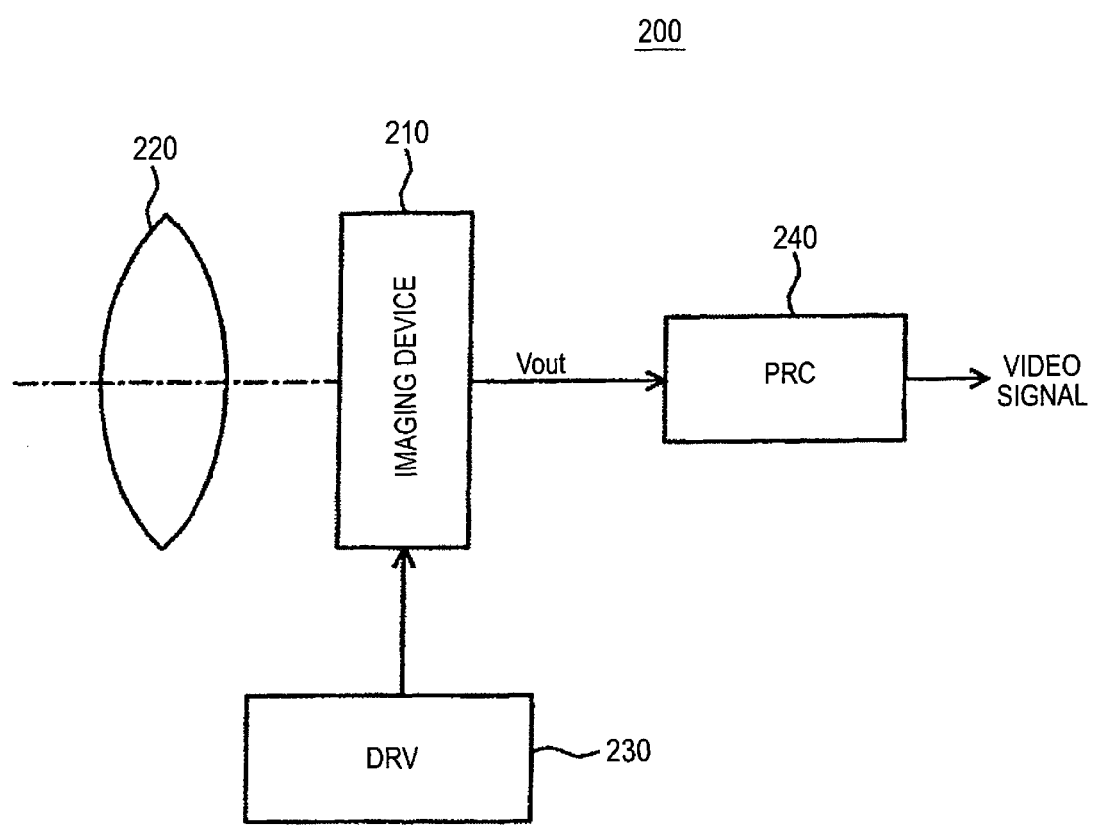
FIG. 21 is a view showing a configuration example of a camera system to which the solid-state imaging device is applied according to an embodiment of the invention.

FIG. 21 is a view showing a configuration example of a camera system to which the solid-state imaging device according to an embodiment of the invention is applied.

A camera system 200 includes an imaging device 210 to which the solid-state imaging device 100 according to the embodiment can be applied as shown in FIG. 21.

The camera system 200 includes, for example, a lens 220 which images incident light (image light) on an imaging surface as an optical system leading incident light to a pixel area of the imaging device 210 (imaging a subject image).

The camera system 200 further includes a drive circuit (DRV) 230 driving the imaging device 210 and a signal processing circuit (PRC) 240 processing output signals of the imaging device 210.

The drive circuit 230 includes a timing generator (not shown) generating various timing signals including a start pulse and a clock pulse driving circuits in the imaging device 210, driving the imaging device 210 by a given timing signal.

The signal processing circuit 240 performs given signal processing to output signals of the imaging device 210.

The image signals processed in the signal processing circuit 240 are recorded in a storage medium such as a memory. Image information recorded in the recording medium is hard-copied by a printer and the like. Image signals processed in the signal processing circuit 240 are reproduced on a monitor including a liquid crystal display and the like as moving images.

As described above, the above solid-state imaging device 100 is mounted as the imaging device 210 on the imaging device such as the digital still camera, thereby realizing a high-precision camera.

The present application contains subject matter related to that disclosed in Japanese Priority Patent Application JP 2010-021898 filed in the Japan Patent Office on Feb. 3, 2010, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A duty correction circuit comprising:
   a C-element including a first input and a second input; and
   an inverter connected to the second input of the C-element,
   wherein the C-element
   obtains an output of a logic "1" when both inputs are the logic "1",
   obtains an output of a logic "0" when both inputs are the logic "0", and
   maintains the output to a previous state in other conditions, and
   complementary clocks having a phase difference of an approximately half cycle are inputted to the first input of the C-element and the inverter respectively.

2. The duty correction circuit according to claim 1,
wherein a pass-gate capacitor is connected to the first input of the C-element.

3. The duty correction circuit according to claim 2,
wherein the pass-gate capacitor is formed so as to cancel the effect of duty deviation given by delay of the inverter.

4. A DLL circuit comprising:
a delay line generated by plural delay elements connected to a clock input in cascade;
a delay loop having a delay locked loop (DLL) function of performing delay synchronization to lock the circuit by comparing phase difference between an inputted clock and a clock delayed for one cycle through the delay line; and
at least one duty correction circuit to which two clocks having a phase difference of an approximately half cycle in the delay line are inputted,
wherein the duty correction circuit includes
a C-element including a first input and a second input, and
an inverter connected to the second input of the C-element,
in which the C-element
obtains an output of a logic "1" when both inputs are the logic "1",
obtains an output of a logic "0" when both inputs are the logic "0", and
maintains the output to a previous state in other conditions, and
complementary clocks having a phase difference of an approximately half cycle are inputted to the first input of the C-element and the inverter respectively.

5. The DLL circuit according to claim 4,
wherein a pass-gate capacitor is connected to the first input of the C-element.

6. The DLL circuit according to claim 5,
wherein the pass-gate capacitor is formed so as to cancel the effect of duty deviation given by delay of the inverter.

7. A column A/D converter comprising:
a DLL circuit having a delay locked loop (DLL) function of performing delay synchronization to lock the circuit by comparing phase difference between an inputted clock and a clock delayed for one cycle through a delay line and supplying complementary clocks having a phase difference of an approximately half cycle obtained by performing delay synchronization based on the input clock;
plural clock transfer lines through which the complementary clocks are propagated; and
integrating-type analog/digital (A/D) converters arranged in parallel, to which the complementary clocks transferred through the clock transfer lines are supplied,
wherein each integrating-type A/D converter includes
a comparator comparing a reference voltage having a ramp waveform in which a voltage value linearly varies with time to an input voltage,
a higher bit counter starting and stopping operations by taking inversion of an output signal of the comparator as a trigger, counting clocks by each clock cycle of one of the clocks, and
a time-to-digital converter outputting lower bits having higher resolution than a clock cycle by latching phase information at a timing when the output signal of the comparator is inverted by the complementary clocks and by decoding the latched value, and
a duty correction circuit is arranged at least at any of an output stage of the complementary clocks of the DLL circuit, the clock transfer lines and an input stage of the complementary clocks from the clock transfer lines in each integrating-type A/D converter,
the duty correction circuit includes
a C-element including a first input and a second input, and
an inverter connected to the second input of the C-element,
in which the C-element obtains an output of a logic "1" when both inputs are the logic "1", obtains an output of a logic "0" when both inputs are the logic "0", and maintains the output to a previous state in other conditions, and
complementary clocks having a phase difference of an approximately half cycle are inputted to the first input of the C-element and the inverter respectively.

8. The column A/D converter according to claim 7,
wherein a repeater relaying the clock is arranged in the clock transfer line and
the duty correction circuit is arranged at an input stage of the repeater.

9. The column A/D converter according to claim 7 or 8,
wherein a pass-gate capacitor is connected to the first input of the C-element.

10. A solid-state imaging device comprising:
a pixel unit in which plural pixels performing photoelectric conversion are arranged in a matrix state; and
a pixel-signal reading unit reading pixel signals from the pixel unit by units of respective plural pixels,
wherein the pixel signal reading unit includes a column A/C converter in which integrating-type analog/digital (A/D) converters converting read analog signals into digital signals are arranged in parallel so as to correspond to column arrangement of pixels,
the column A/D converter includes
a DLL circuit having a delay locked loop (DLL) function of performing delay synchronization to lock the circuit by comparing phase difference between an inputted clock and a clock delayed for one cycle through a delay line and supplying complementary clocks having a phase difference of an approximately half cycle obtained by performing delay synchronization of the input clock,
plural clock transfer lines through which the complementary clocks are propagated and
integrating-type analog/digital (A/D) converters arranged in parallel, to which the complementary clocks transferred through the clock transfer lines are supplied,
in which each integrating-type A/D converter includes
a comparator comparing a reference voltage having a ramp waveform in which a voltage value linearly varies with time to an input voltage,
a higher bit counter starting and stopping operations by taking inversion of an output signal of the comparator as a trigger, counting clocks by each clock cycle of one of the clocks, and
a time-to-digital converter outputting lower bits having higher resolution than a clock cycle by latching phase information at a timing when the output signal of the comparator is inverted by the complementary clocks and by decoding the latched value, and
a duty correction circuit is arranged at least at any of an output stage of the complementary clocks of the DLL circuit, the transfer lines of the clocks and an input stage of the complementary clocks from the clock transfer line in the integrating-type A/D converter,
the duty correction circuit includes
a C-element including a first input and a second input, and
an inverter connected to the second input of the C-element,
in which the C-element obtains an output of a logic "1" when both inputs are the logic "1", obtains an output of a logic "0" when both inputs are the logic "0", and maintains the output to a previous state in other conditions, and complementary clocks having a phase difference of an approximately half cycle are inputted to the first input of the C-element and the inverter respectively.

11. A camera system comprising:

a solid-state imaging device; and an optical system imaging a subject image on the solid-state imaging device, wherein the solid-state imaging device includes a pixel unit in which plural pixels performing photoelectric conversion are arranged in a matrix state, and a pixel-signal reading unit reading pixel signals from the pixel unit by units of respective plural pixels, in which the pixel signal reading unit includes a column A/D converter in which integrating-type analog/digital (A/D) converters converting read analog signals into digital signals are arranged in parallel so as to correspond to column arrangement of pixels, the column A/C converter includes a DLL circuit having a delay locked loop (DLL) function of performing delay synchronization to lock the circuit by comparing phase difference between an inputted clock and a clock delayed for one cycle through a delay line and supplying complementary clocks having a phase difference of an approximately half cycle obtained by performing delay synchronization of the input clock, plural clock transfer lines through which the complementary clocks are propagated and integrating-type analog/digital (A/D) converters arranged in parallel, to which the complementary clocks transferred through the clock transfer lines are supplied, in which each integrating-type A/D converter includes a comparator comparing a reference voltage having a ramp waveform in which a voltage value linearly varies with time to an input voltage, a higher bit counter starting and stopping operations by taking inversion of an output signal of the comparator as a trigger, counting clocks by each clock cycle of one of the clocks, and a time-to-digital converter outputting lower bits having higher resolution than a clock cycle by latching phase information at a timing when the output signal of the comparator is inverted by the complementary clocks by decoding the latched value, a duty correction circuit is arranged at least at any of an output stage of the complementary clocks of the DLL circuit, the transfer lines of the clocks and an input stage of the complementary clocks from the clock transfer line in each integrating-type A/D converter, the duty correction circuit includes a C-element including a first input and a second input, and an inverter connected to the second input of the C-element, in which the C-element obtains an output of a logic "1" when both inputs are the logic "1", obtains an output of a logic "0" when both inputs are the logic "0", and maintains the output to a previous state in other conditions, and complementary clocks having a phase difference of an approximately half cycle are inputted to the first input of the C-element and the inverter respectively.

* * * * *